(12) United States Patent
Aoki

(10) Patent No.: US 8,110,882 B2
(45) Date of Patent: Feb. 7, 2012

(54) SEMICONDUCTOR DEVICE WITH MAGNETIC POWDER MIXED THEREIN AND MANUFACTURING METHOD THEREOF

(75) Inventor: Yutaka Aoki, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 167 days.

(21) Appl. No.: 12/069,689

(22) Filed: Feb. 12, 2008

(65) Prior Publication Data

US 2008/0191349 A1 Aug. 14, 2008

(30) Foreign Application Priority Data

Feb. 13, 2007 (JP) ................................. 2007-031757
Feb. 23, 2007 (JP) ................................. 2007-043355

(51) Int. Cl.
 *H01L 29/82* (2006.01)
(52) U.S. Cl. ........ 257/422; 257/531; 257/659; 257/737; 438/3
(58) Field of Classification Search ................... 257/737, 257/422, 531, 659; 438/613, 3
 See application file for complete search history.

(56) References Cited

U.S. PATENT DOCUMENTS

| | | | | |
|---|---|---|---|---|
| 4,972,241 | A * | 11/1990 | Fukuda et al. | 257/422 |
| 5,834,825 | A | 11/1998 | Imai | |
| 6,914,183 | B2 | 7/2005 | Inazawa et al. | |
| 7,049,676 | B2 | 5/2006 | Tanabe et al. | |
| 2002/0017730 | A1* | 2/2002 | Tahara et al. | 257/786 |
| 2002/0064922 | A1* | 5/2002 | Lin | 438/381 |
| 2004/0222487 | A1* | 11/2004 | Tanabe et al. | 257/508 |
| 2005/0003199 | A1* | 1/2005 | Takaya et al. | 428/413 |
| 2005/0017346 | A1* | 1/2005 | Yamagata | 257/701 |
| 2005/0094302 | A1* | 5/2005 | Matsuzaki et al. | 360/55 |
| 2007/0120681 | A1* | 5/2007 | Yamazaki et al. | 340/572.8 |

FOREIGN PATENT DOCUMENTS

CN 1494372 A 5/2004

(Continued)

OTHER PUBLICATIONS

Japanese Office Action dated Jul. 21, 2009 and English translation thereof issued in a counterpart Japanese Application No. 2007-031757.

(Continued)

*Primary Examiner* — Thanh V Pham
*Assistant Examiner* — Maria Ligai
(74) *Attorney, Agent, or Firm* — Holtz, Holtz, Goodman & Chick, PC

(57) ABSTRACT

A semiconductor device includes a semiconductor substrate on one side of which an integrated circuit and a plurality of connection pads connected to the integrated circuit are provided. An insulating film is provided on the plurality of connection pads except for parts of the connection pads and on the one side of the semiconductor substrate. A plurality of wiring lines are provided to be electrically connected to the integrated circuit via the connection pads, each of the wiring lines having a connection pad portion. A plurality of columnar electrodes are respectively provided on one side of the connection pad portions of the wiring lines. A sealing film is provide on the peripheries of the columnar electrodes to cover the integrated circuit and which is provided. At least one of the insulating film and the sealing film is formed of a resin in which magnetic powder is mixed.

7 Claims, 25 Drawing Sheets

FOREIGN PATENT DOCUMENTS

| | | |
|---|---|---|
| JP | 6-333740 | 12/1994 |
| JP | 8-255811 A | 10/1996 |
| JP | 9-186291 A | 7/1997 |
| JP | 2000-311226 A | 11/2000 |
| JP | 2002-184945 A | 6/2002 |
| JP | 3540729 B2 | 4/2004 |
| JP | 2004-214561 A | 7/2004 |
| JP | 2004-342876 A | 12/2004 |
| JP | 2005-235944 A | 9/2005 |
| JP | 2006-059839 A | 3/2006 |
| JP | 2006-319094 A | 11/2006 |
| WO | WO 2005/088704 A1 | 9/2005 |

OTHER PUBLICATIONS

Japanese Office Action dated Jun. 30, 2009 (3 pages), and English translation thereof (3 pages), issued in counterpart Japanese Application Serial No. 2007-043355.

Chinese Office Action dated Jan. 8, 2010 and English translation thereof in counterpart Chinese Application No. 2008100881988.

Japanese Office Action dated Oct. 13, 2009 and English translation thereof issued in a counterpart Japanese Application No. 2007-043355.

Korean Office Action dated Jun. 28, 2010 (and English translation thereof) in counterpart Korean Application No. 10-2008-0012598.

* cited by examiner

SEMICONDUCTOR DEVICE WITH MAGNETIC POWDER MIXED THEREIN AND MANUFACTURING METHOD THEREOF

CROSS-REFERENCE TO RELATED APPLICATIONS

This application is based upon and claims the benefit of priority from prior Japanese Patent Applications No. 2007-031757, filed Feb. 13, 2007; and No. 2007-043355, filed Feb. 23, 2007, the entire contents of both which are incorporated herein by reference.

BACKGROUND OF THE INVENTION

1. Field of the Invention

The present invention relates to a semiconductor device and a manufacturing method thereof, the semiconductor device comprising: a semiconductor substrate which includes, on one side, an integrated circuit and a plurality of connection pads connected to this integrated circuit; an insulating film provided on the one side of the semiconductor substrate except for the plurality of connection pads; a plurality of wiring lines which are provided to be electrically connected to the integrated circuit via the connection pads and which have connection pad portions; a plurality of projecting or columnar electrodes provided on one side of the connection pad portions of the wiring lines; and a sealing film which covers the integrated circuit and which is provided on the peripheries of the projecting electrodes.

2. Description of the Related Art

A semiconductor device called a chip size package (CSP) in Jpn. Pat. Appln. KOKAI Publication No. 2004-342876 (FIG. 6) comprises: a plurality of wiring lines provided on a semiconductor substrate; columnar electrodes provided on the upper surfaces of connection pad portions of the wiring lines; a sealing film made of, for example, an epoxy resin provided on the semiconductor substrate and the wiring lines so that the upper surface of this sealing film is flush with the upper surfaces of the columnar electrodes; and solder balls provided on the upper surfaces of the columnar electrodes.

In this conventional semiconductor device, the upper surface side of the semiconductor substrate can be protected against pollution from external atmosphere and against damage owing to the sealing film made of, for example, the epoxy resin, but this semiconductor device has a problem of not being able to suppress unnecessary electromagnetic radiant noise from the upper surface side of the semiconductor substrate to the outside or from the outside to the upper surface side of the semiconductor substrate.

Patent Publication No. 3540729 has disclosed another semiconductor device comprising a spiral thin film induction element in a chip size package (CSP).

In this conventional semiconductor device, the spiral thin film induction element is provided on the upper surface of a protective film, so that an eddy current loss is caused in the thin film induction element by an eddy current generated in a semiconductor substrate, leading to a problem of deteriorated characteristics (a decreased Q value) of the thin film induction element.

BRIEF SUMMARY OF THE INVENTION

The present invention is directed to provide a semiconductor device and a manufacturing method thereof which make it possible to suppress unnecessary electromagnetic radiant noise from an integrated circuit on the upper surface side of a semiconductor substrate to the outside or from the outside to the integrated circuit on the upper surface side of the semiconductor substrate.

The present invention is also directed to reduce an eddy current loss in a thin film induction element due to an eddy current generated in a semiconductor substrate in a semiconductor device having the thin film induction element on the semiconductor substrate.

A semiconductor device according to one aspect of the present invention comprises:

a semiconductor substrate which includes, on one side, an integrated circuit and a plurality of connection pads connected to this integrated circuit;

an insulating film provided on the plurality of connection pads except for parts of the connection pads and on the one side of the semiconductor substrate;

a plurality of wiring lines which are provided to be electrically connected to the integrated circuit via the connection pads, each of the wiring lines having a connection pad portion;

a plurality of columnar electrodes provided on one side of the connection pad portions of the wiring lines; and a sealing film which covers the integrated circuit and which is provided on the peripheries of the columnar electrodes, at least one of the insulating film and the sealing film being formed of a resin in which magnetic powder is mixed.

According to this semiconductor device, the insulating film and/or the sealing film is formed of a resin in which magnetic powder is mixed, so that unnecessary electromagnetic radiant noise from the integrated circuit on the upper surface side of the semiconductor substrate to the outside or from the outside to the integrated circuit on the upper surface side of the semiconductor substrate can be suppressed by the magnetic powder in the insulating film and/or the sealing film.

Furthermore, in a semiconductor device according to another aspect of this invention called a CSP comprising a spiral thin film induction element, a magnetic film in which magnetic powder is mixed in a resin is provided between a semiconductor substrate and the thin film induction element, so that it is possible to reduce an eddy current loss in the thin film induction element due to an eddy current generated in the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
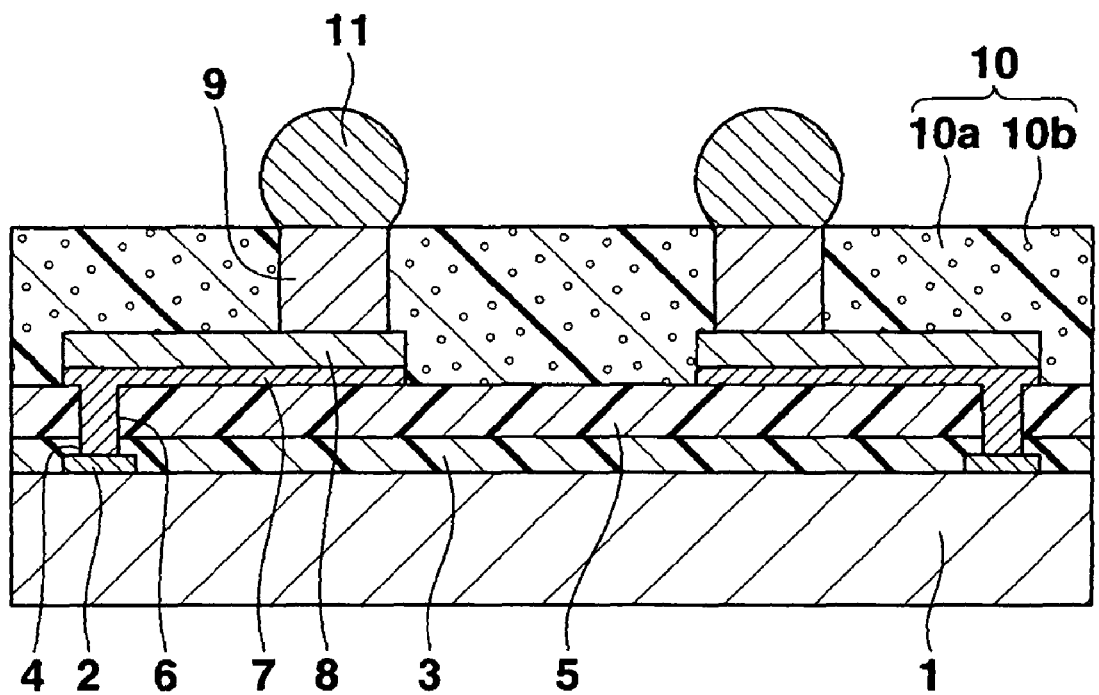
FIG. 1 is a sectional view of a semiconductor device as a first embodiment of this invention.

FIG. 1 is a sectional view of a semiconductor device as a first embodiment of this invention. This semiconductor device is called a CSP, and includes a silicon substrate (semiconductor substrate) 1. An integrated circuit (not shown) having a predetermined function is provided on the upper surface or one side of the silicon substrate 1, and a plurality of connection pads 2 made of a metal such as an aluminum-based metal are provided on peripheral parts of the upper surface of the silicon substrate 1 so that these connection pads are electrically connected to the integrated circuit.

An insulating film 3 made of, for example, silicon oxide, is provided on the upper surfaces of the connection pads 2 except for the centers of the connection pads 2 and on the upper surface of the silicon substrate 1. The centers of the connection pads 2 are exposed via openings 4 formed in the insulating film 3. A protective-film 5 made of a thermosetting resin such as a polyimide resin or epoxy resin is provided on the upper surface of the insulating film 3. Openings 6 are formed in parts of the protective film 5 corresponding to the openings 4 of the insulating film 3.

A plurality of foundation metal layers 7 made of a metal containing copper are provided on the upper surface of the protective film 5. A wiring line 8 made of copper is provided on the entire upper surface of each of the foundation metal layers 7. One end of the foundation metal layer 7 is connected to the corresponding connection pad 2 via the openings 4, 6 of the insulating film 3 and the protective film 5, so that the wiring line 8 is electrically connected to the connection pad 2. Columnar electrodes (projecting electrodes) 9 made of copper are provided on the upper surfaces of connection pad portions of the wiring lines 8.

A sealing film 10 is provided on the upper surfaces of the wiring lines 8 and the protective film 5 so that an upper surface of this sealing film 10 is flush with the upper surfaces of the columnar electrodes 9. The sealing film 10 is formed of a material in which one or more kinds of soft magnetic powder or particles 10b made of a material or materials selected from the group consisting of NiCuZn, FeCoBN and CoHfTaPd are mixed into a thermosetting resin 10a made of, for example, a polyimide resin or epoxy resin. A solder ball 11 is provided on the upper surface of each of the columnar electrodes 9.

As described above, in this semiconductor device, the sealing film 10 is formed of a material in which the soft magnetic powder 10b made of, for example, NiCuZn, FeCoBN or CoHfTaPd is mixed or distributed in a uniformity or ununiformity state into the thermosetting resin 10a made of, for example, the polyimide resin or epoxy resin. Thus, the soft magnetic powder or particles 10b in the sealing film 10 can suppress unnecessary electromagnetic radiant noise from the upper surface side (integrated circuit) of silicon substrate 1.

Figure 2:
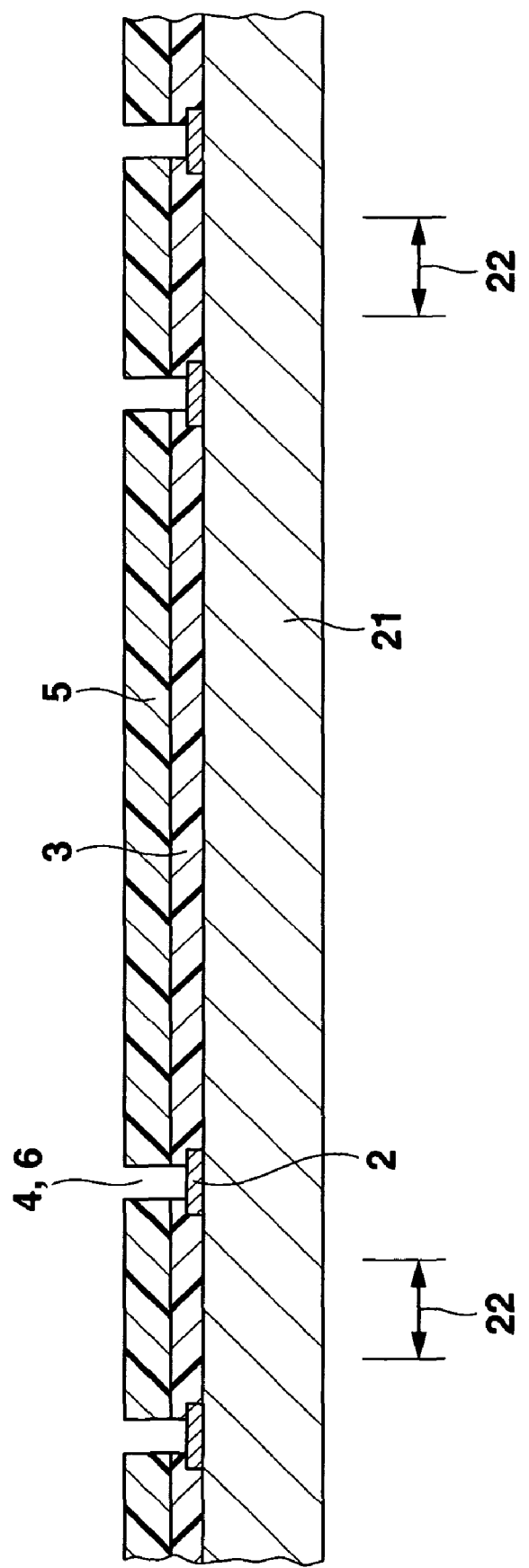
FIG. 2 is a sectional view of an initially prepared assembly in manufacturing the semiconductor device shown in FIG. 1.

Next, one example of a method of manufacturing this semiconductor device will be described. First, as shown in FIG. 2, an assembly is prepared in which the connection pads 2 made of the aluminum-based metal, the insulating film 3 made of, for example, silicon oxide, and the protective film 5 made of, for example, polyimide resin or epoxy resin are formed on the upper surface of the silicon substrate (hereinafter referred to as a semiconductor wafer 21) in a wafer state, the centers of the connection pads 2 being exposed via the openings 4, 6 of the insulating film 3 and the protective film 5.

In this case, the integrated circuits (not shown) with a predetermined function are formed in regions on the upper surface of the semiconductor wafer 21 where the semiconductor devices are to be formed, and the connection pads 2 are electrically connected to the integrated circuits formed in corresponding parts. In FIG. 2, regions indicated by a numeral 22 correspond to dicing lines.

Figure 3:
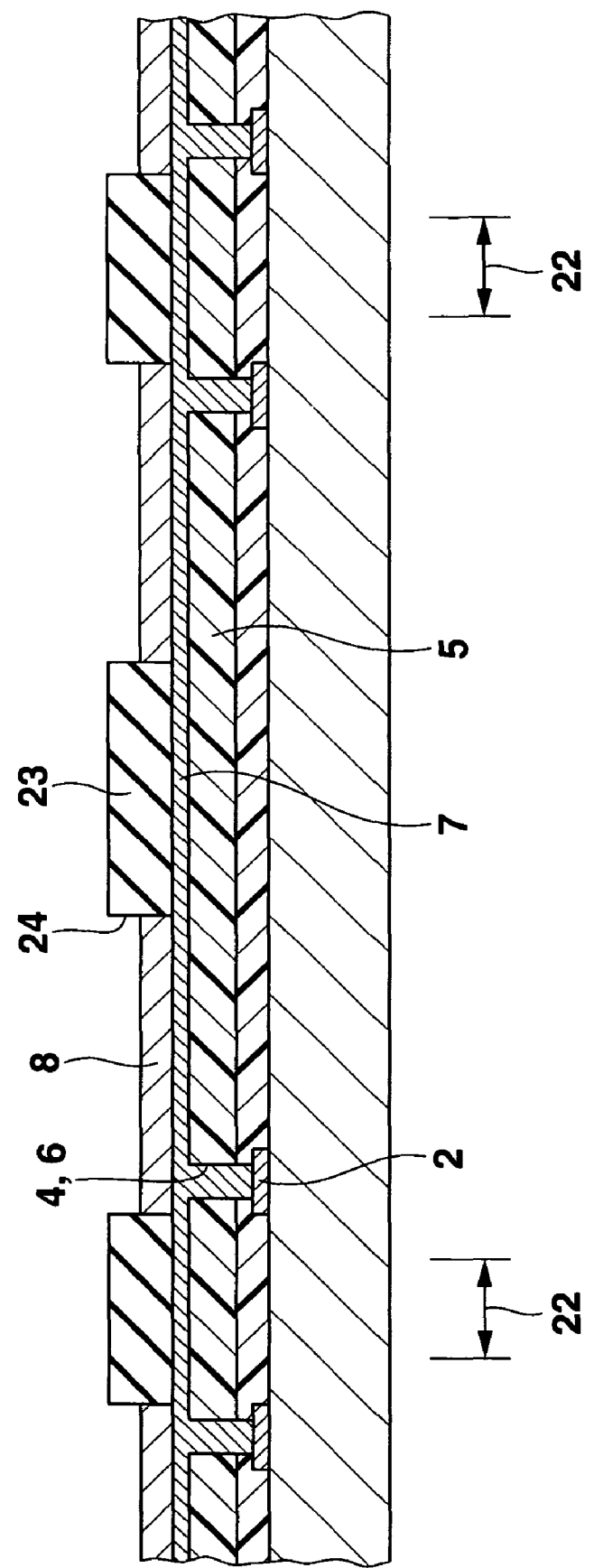
FIG. 3 is a sectional view showing the assembly in a step following FIG. 2.

Next, as shown in FIG. 3, the foundation metal layer 7 (specifically, a metal layer for forming a plurality of foundation metal layers 7) is formed on the entire upper surfaces of the protective film 5 and the upper surfaces of the connection pads 2 exposed via the openings 4, 6 of the insulating film 3 and the protective film 5. In this case, the foundation metal layer 7 may only be a copper layer formed by electroless plating, may only be a copper layer formed by sputtering, or may be a copper layer formed by sputtering on a thin film layer such as titanium formed by sputtering.

Next, a plating resist film 23 is patterned/formed on the upper surface of the foundation metal layer 7. In this case, openings 24 are formed in parts of the plating resist film 23 corresponding to regions where the wiring lines 8 are formed.

Then, electrolytic plating with copper is carried out using the foundation metal layer 7 as a plating current path, thereby forming the wiring lines 8 on the upper surface of the foundation metal layer 7 in the openings 24 of the plating resist film 23. Subsequently, the plating resist film 23 is released.

Figure 4:
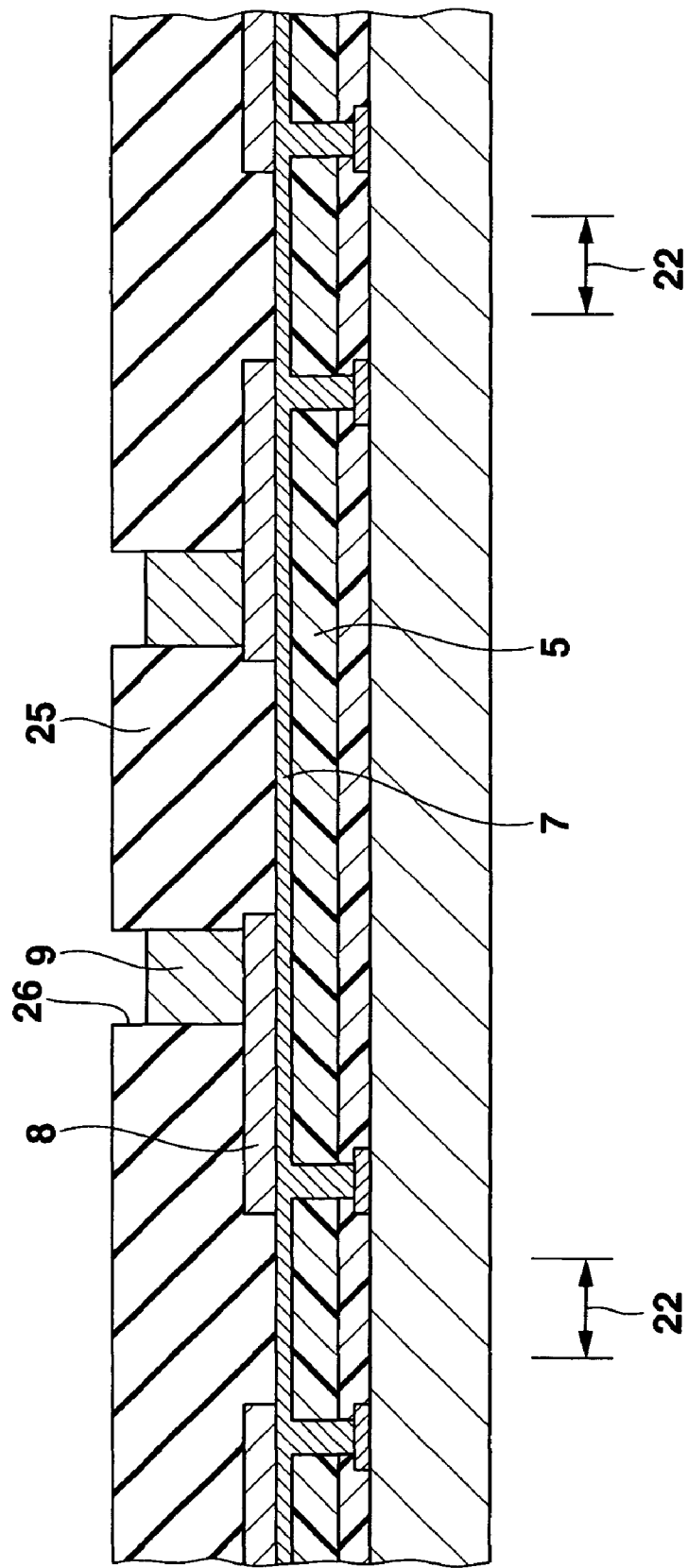
FIG. 4 is a sectional view showing the assembly in a step following FIG. 3.
Figure 5:
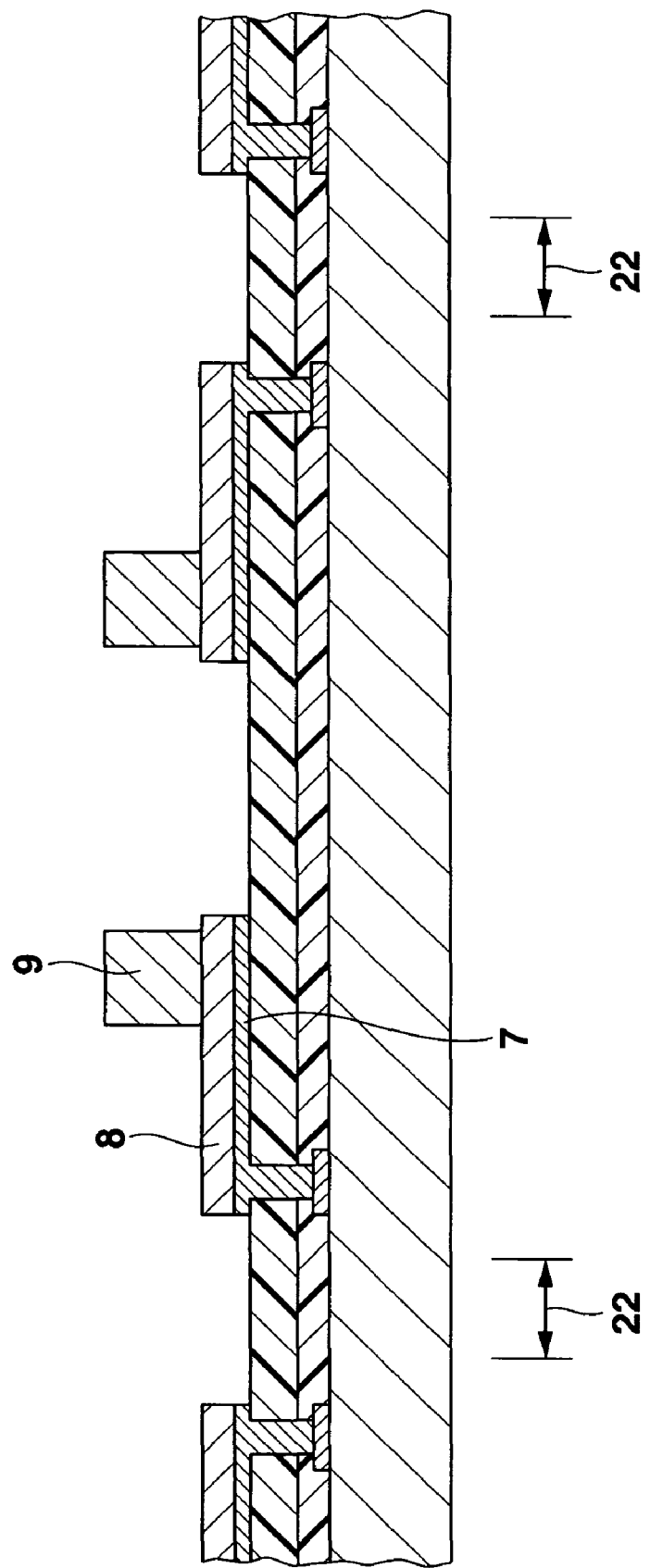
FIG. 5 is a sectional view showing the assembly in a step following FIG. 4.

Next, as shown in FIG. 4, a plating resist film 25 is patterned/formed on the upper surfaces of the wiring lines 8 and the foundation metal layer 7. In this case, openings 26 are formed in parts of the plating resist film 25 corresponding to regions where connection pad portions of the wiring lines 8, that is, the columnar electrodes 9 are to be formed. Then, electrolytic plating with copper is carried out using the foundation metal layer 7 as a plating current path, such that the columnar electrodes 9 are formed on the upper surfaces of the connection pad portions of the wiring lines 8 in the openings 26 of the plating resist film 25. Subsequently, the plating resist film 25 is released, and then the wiring lines 8 are used as masks to etch and remove unnecessary parts of the foundation metal layer 7, such that the foundation metal layer 7 remains under the wiring lines 8 alone, as shown in FIG. 5.

Figure 6:
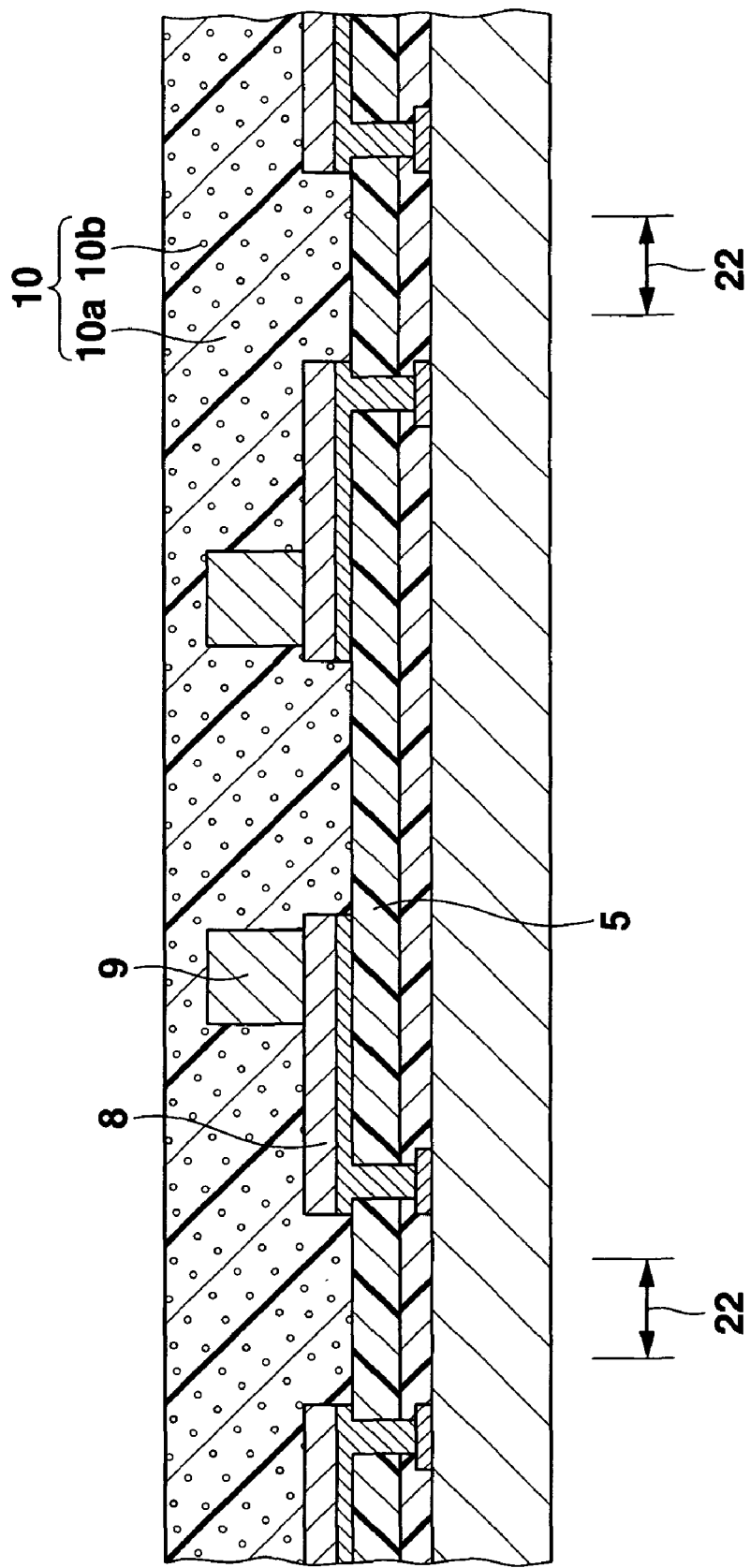
FIG. 6 is a sectional view showing the assembly in a step following FIG. 5.

Next, as shown in FIG. 6, the sealing film 10 made of a material in which one or a plurality of kinds of soft magnetic powder 10b selected from NiCuZn, FeCoBN and CoHfTaPd or the like is mixed into the thermosetting resin 10a made of, for example, the polyimide resin or epoxy resin is formed on the upper surfaces of the wiring lines 8, the columnar electrodes 9 and the protective film 5 by, for example, a screen printing method or a spin coat method so that the thickness of this sealing film 10 is slightly greater than the height of the columnar electrodes 9. In this state, the upper surfaces of the columnar electrodes 9 are covered with the sealing film 10. In order to form the sealing film 10, the material in which the soft magnetic powder 10b is mixed into the thermosetting resin 10a has only to be applied by, for example, the screen printing method or spin coat method, so that the number of manufacturing processes is not increased.

Figure 7:
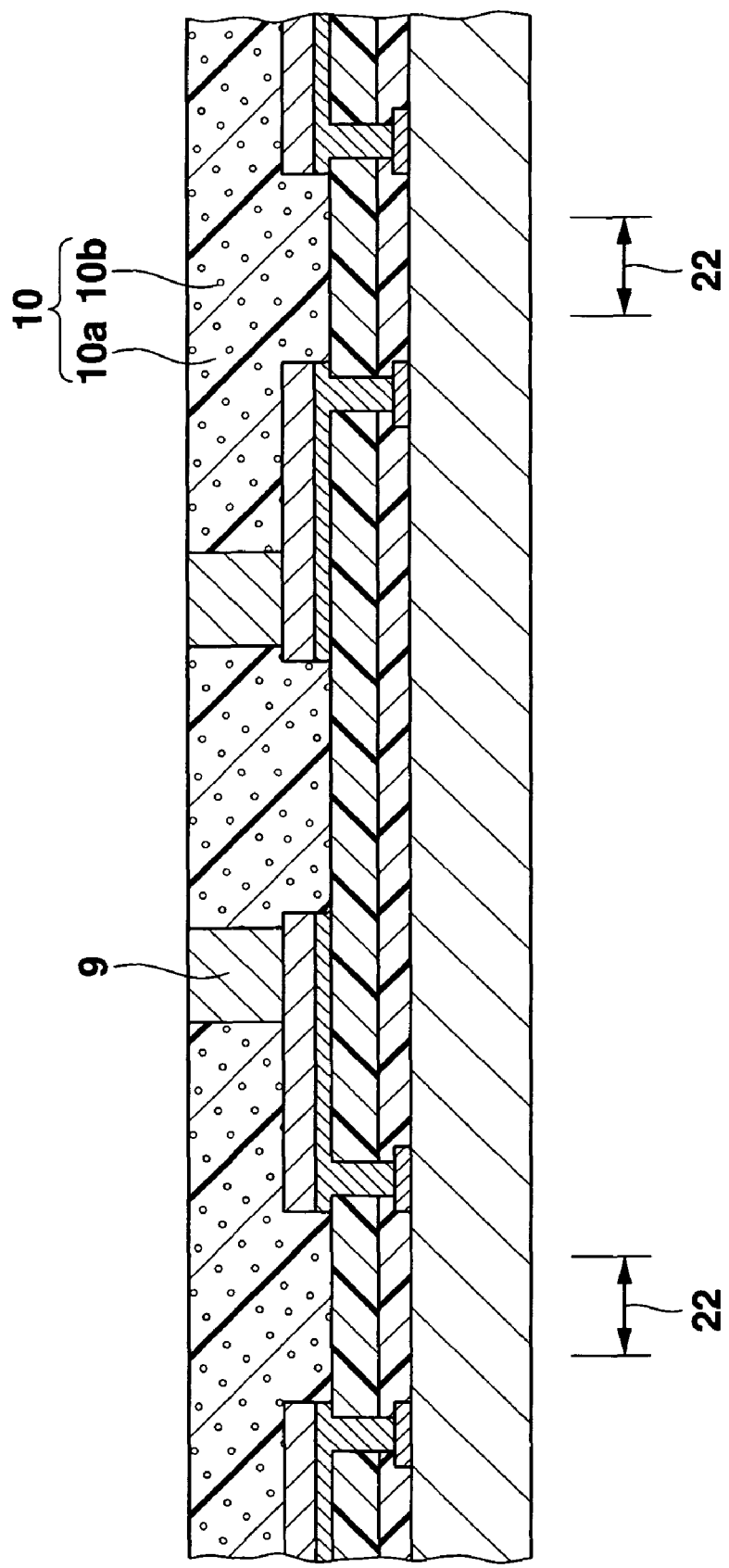
FIG. 7 is a sectional view showing the assembly in a step following FIG. 6.
Figure 8:
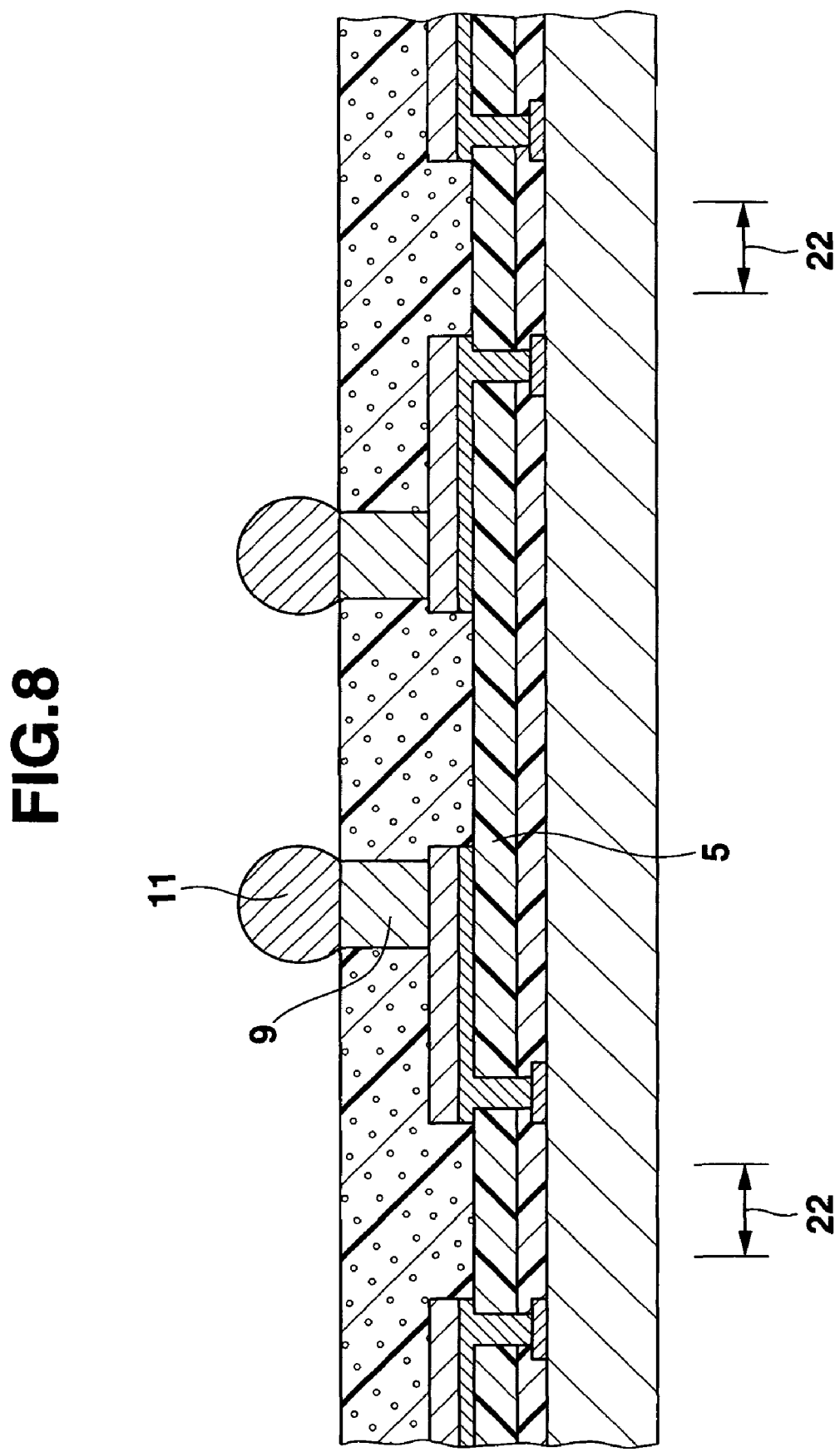
FIG. 8 is a sectional view showing the assembly in a step following FIG. 7.
Figure 9:
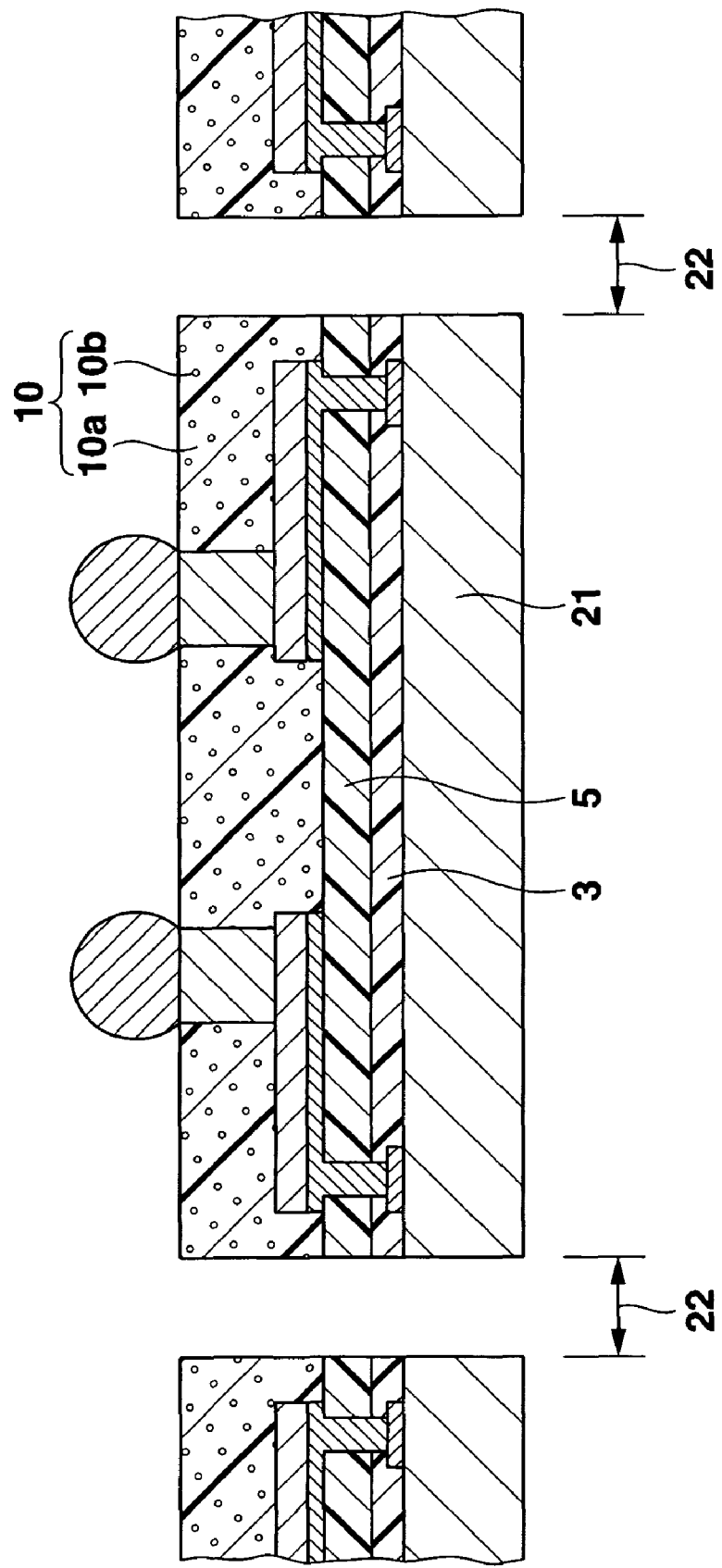
FIG. 9 is a sectional view showing the assembly in a step following FIG. 8.

Next, the upper surface side of the sealing film 10 is properly polished and removed, such that the upper surfaces of the columnar electrodes 9 are exposed, and the exposed upper surfaces of the columnar electrodes 9 and the upper surface of the sealing film 10 are planarized by etching and/or polishing, as shown in FIG. 7. Then, as shown in FIG. 8, the solder balls 11 are formed on the upper surfaces of the columnar electrodes 9. Then, as shown in FIG. 9, the sealing film 10, the protective film 5, the insulating film 3 and the semiconductor wafer 21 are diced along the dicing lines 22, thereby obtaining a plurality of semiconductor devices shown in FIG. 1.

Second Embodiment

Figure 10:
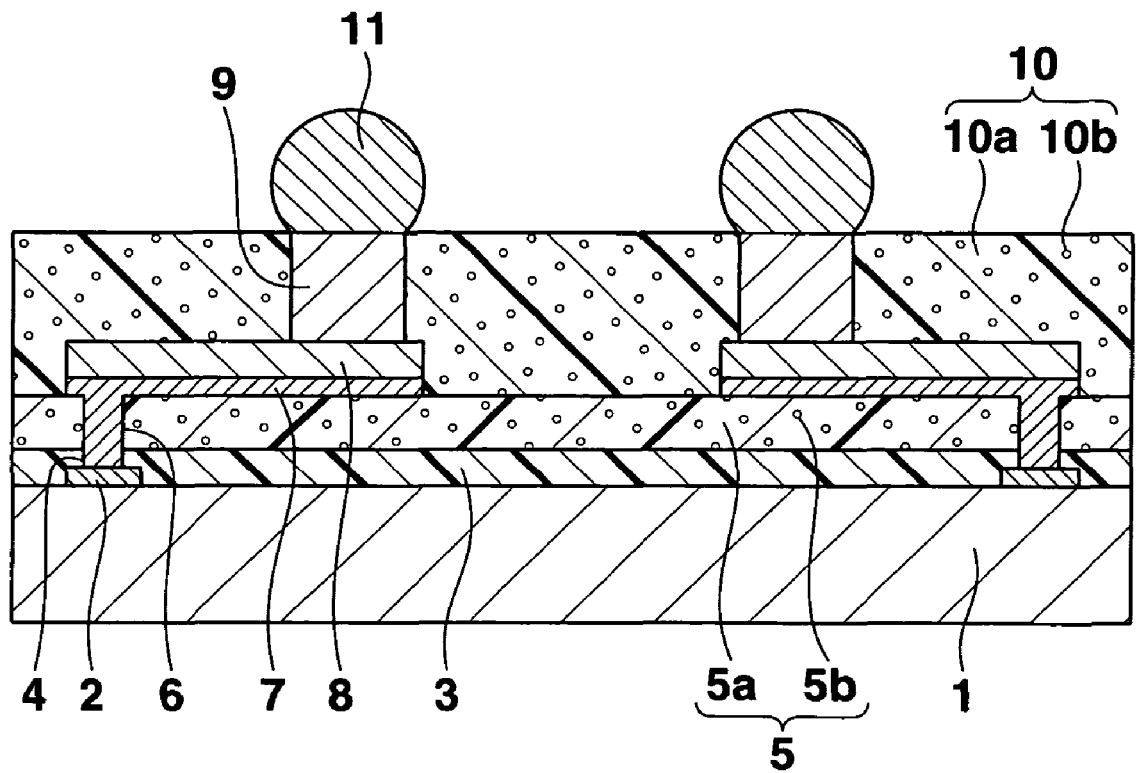
FIG. 10 is a sectional view of a semiconductor device as a second embodiment of this invention.

FIG. 10 is a sectional view of a semiconductor device as a second embodiment of this invention. This semiconductor device is different from the semiconductor device shown in FIG. 1 in that a protective film (insulating film) 5 is also formed of a material in which a soft magnetic powder 5b is mixed into a thermosetting resin 5a made of, for example, the polyimide resin or epoxy resin, in the same manner as a sealing film 10.

In this semiconductor device, the soft magnetic powder 10b, 5b in the sealing film 10 and the protective film 5 can further suppress unnecessary electromagnetic radiant noise from the upper surface side (integrated circuit) of a silicon substrate 1 to the outside or from the outside to the upper surface side (integrated circuit) of the silicon substrate 1 than in the case of the semiconductor device shown in FIG. 1. Moreover, in order to form the protective film 5, the material in which the soft magnetic powder 5b is mixed into the thermosetting resin 5a has only to be applied by, for example, the screen printing method or spin coat method, so that the number of manufacturing processes is not increased.

Third Embodiment

Figure 11A:
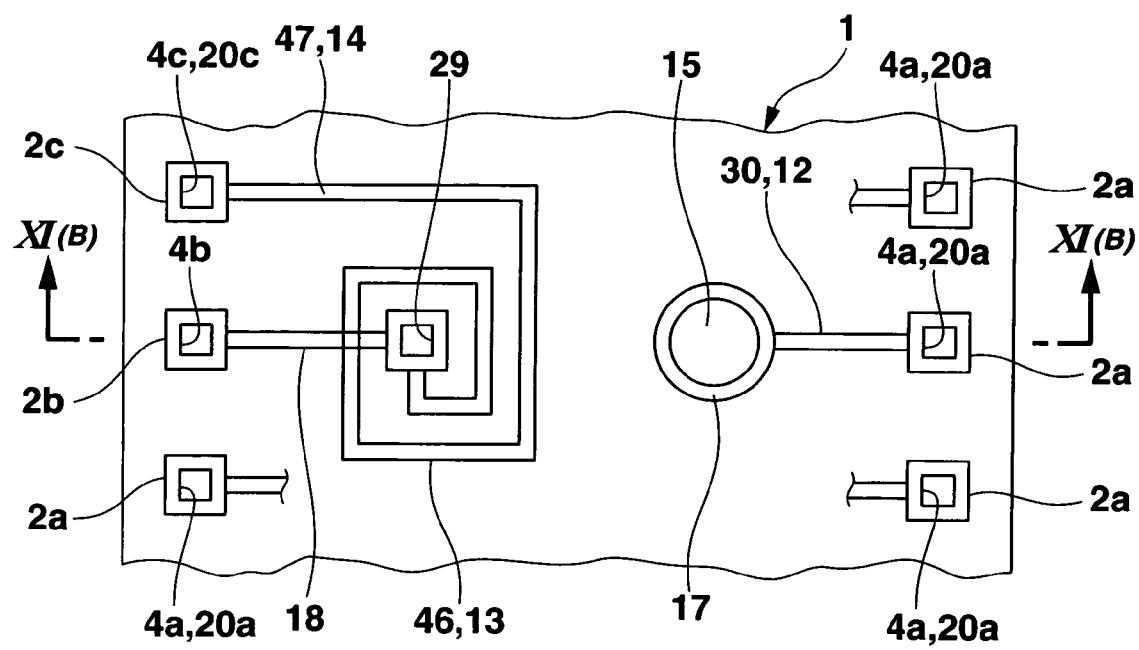
FIG. 11A is a transmitted plan view of essential parts of a semiconductor device according to a third embodiment of this invention.
Figure 11B:
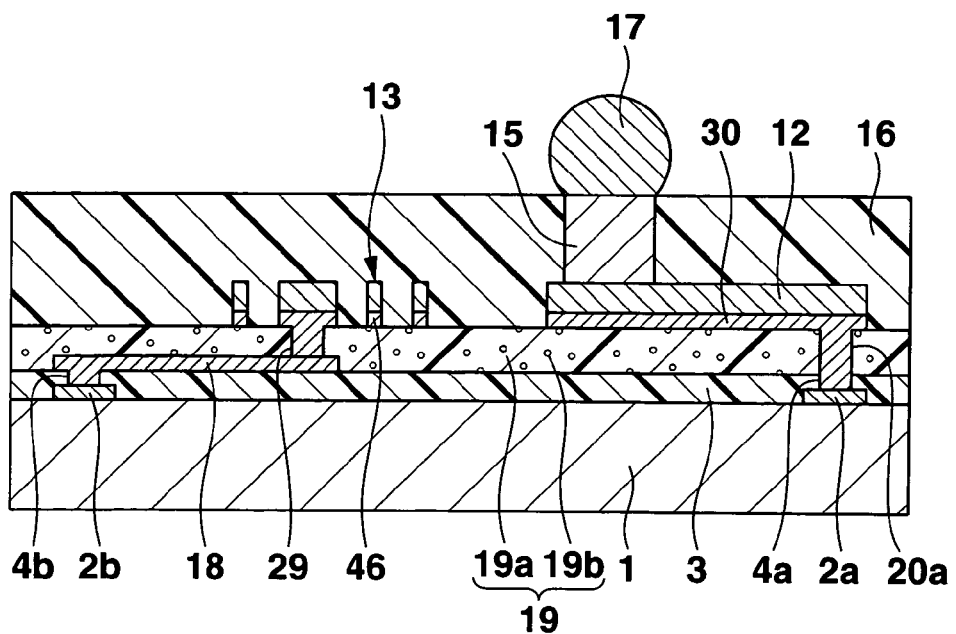
FIG. 11B is a sectional view along the XI(B)-XI(B) line in FIG. 11A.

FIG. 11A is a transmitted plan view of essential parts of a semiconductor device as a third embodiment of this invention, and FIG. 11B is a sectional view along the XI(B)-XI(B) line in FIG. 11A. This semiconductor device is generally called a CSP, and comprises a flat square silicon substrate (semiconductor substrate) 1. An integrated circuit (not shown) having a predetermined function is provided on the upper surface or one side of the silicon substrate 1, and a plurality of connection pads 2a, 2b, 2c made of a metal such as an aluminum-based metal are provided in peripheral parts of the upper surface of the silicon substrate 1 so that these connection pads are connected to the integrated circuit. In this case, the connection pads indicated by the numerals 2b, 2c are connected to both ends of a spiral thin film induction element 13 described later, and are arranged adjacently to each other in FIG. 11A.

An insulating film 3 made of, for example, silicon oxide, is provided on the upper surfaces of the connection pads 2a, 2b, 2c except for the centers of the connection pads 2a, 2b, 2c and on the upper surface of the silicon substrate 1. The centers of the connection pads 2a, 2b, 2c are exposed via openings 4a, 4b, 4c provided in the insulating film 3. A thin film induction element wiring line 18 made of a metal such as an aluminum-based metal is provided on the upper surface of the insulating film 3. One end of the thin film induction element wiring line 18 is connected to the connection pad 2b via the opening 4b of the insulating film 3.

A magnetic film 19 is provided on the upper surfaces of the thin film induction element wiring line 18 and the insulating film 3. This magnetic film 19 is made of a material in which a soft magnetic powder 19b made of, for example, NiCuZn, FeCoBN or CoHfTaPd is mixed into a thermosetting resin 19a made of, for example, the polyimide resin or epoxy resin. Moreover, openings 20a, 20c, 29 are provided in parts of the magnetic film 19 corresponding to the openings 4a, 4c provided in the insulating film 3 and a connection pad portion of the thin film induction element wiring line 18.

A foundation metal layer 30 made of, for example, copper, a spiral thin film induction element foundation metal layer 46 and a spiral thin film induction element foundation metal layer 47 (not shown in FIG. 11B) are provided on the upper surface of the magnetic film 19. A wiring line 12 made of copper, the spiral thin film induction element 13 and a thin film induction element wiring line 14 are provided on the entire upper surfaces of the foundation metal layer 30, the thin film induction element foundation metal layer 46 and the thin film induction element wiring line foundation metal layer 47, respectively.

One end of the foundation metal layer 30 is connected to the connection pad 2a via the openings 4a, 7a of the insulating film 3 and the magnetic film 19, so that the wiring line 12 is electrically connected to the connection pad 2a. The thin film induction element wiring line foundation metal layer 47 and the thin film induction element wiring line 14 are connected at one end to the connection pad 2c via the openings 4c, 20c of the insulating film 3 and the magnetic film 19. The inner ends of the foundation metal layer 46 and the thin film induction element 13 are connected to the connection pad portion of the thin film induction element wiring line 18 via the opening 29 of the magnetic film 19. The outer ends thereof are connected to the other ends of the thin film induction element wiring line foundation metal layer 47 and the thin film induction element wiring line 14.

A columnar electrode 15 made of copper is provided on the upper surface of a connection pad portion of the wiring line 12. A sealing film 16 made of, for example, an epoxy resin is provided on the upper surface of the magnetic film 19 including the wiring line 12 and the thin film induction element 13 so that the upper surface of this sealing film 16 is flush with the upper surface of the columnar electrode 15. A solder ball 17 is provided on the upper surface of the columnar electrode 15.

As described above, in this semiconductor device, the magnetic film 19 made of a material in which the soft magnetic powder 19b is mixed into the thermosetting resin 19a is provided on the upper surface of the insulating film 3 disposed on the silicon substrate 1 under the thin film induction element 13, so that it is possible to reduce an eddy current loss in the thin film induction element 13 due to an eddy current generated in the silicon substrate 1, and it is thus possible to suppress the characteristic deterioration (a decrease of a Q value) of the thin film induction element 13.

Figure 12:
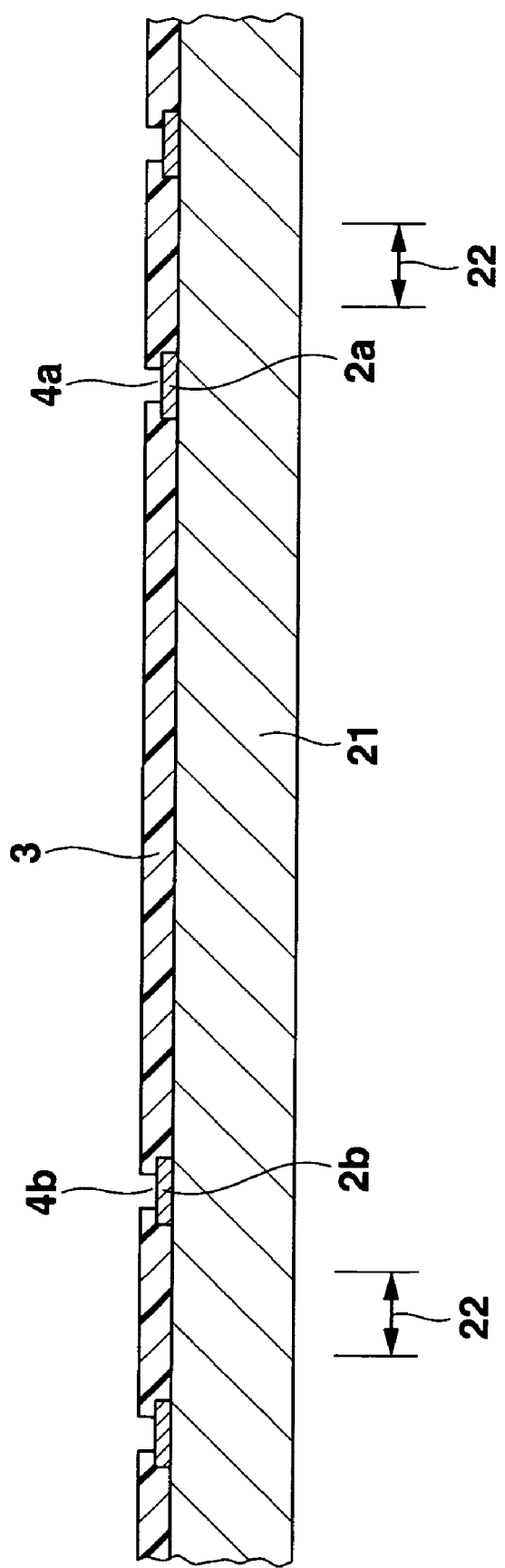
FIG. 12 is a sectional view of an initially prepared assembly in one example of a method of manufacturing the semiconductor device shown in FIG. 11A and FIG. 11B.

Next, one example of a method of manufacturing this semiconductor device will be described. First, as shown in FIG. 12, an assembly is prepared in which the connection pads 2a, 2b made of, for example, the aluminum-based metal and the insulating film 3 made of, for example, silicon oxide are formed on the upper surface of the silicon substrate (hereinafter referred to as a semiconductor wafer 21) in a wafer state, the centers of the connection pads 2a, 2b being exposed via the openings 4a, 4b formed in the insulating film 3.

In this case, the integrated circuits (not shown) with a predetermined function are formed in regions on the upper surface of the semiconductor wafer 21 where the semiconductor devices are formed, and the connection pads 2a, 2b are electrically connected to the integrated circuits formed in corresponding regions. In addition, the connection pad 2c shown in FIG. 11A and components accompanying therewith are not described. Moreover, in FIG. 12, regions indicated by a numeral 22 correspond to dicing lines.

Figure 13:
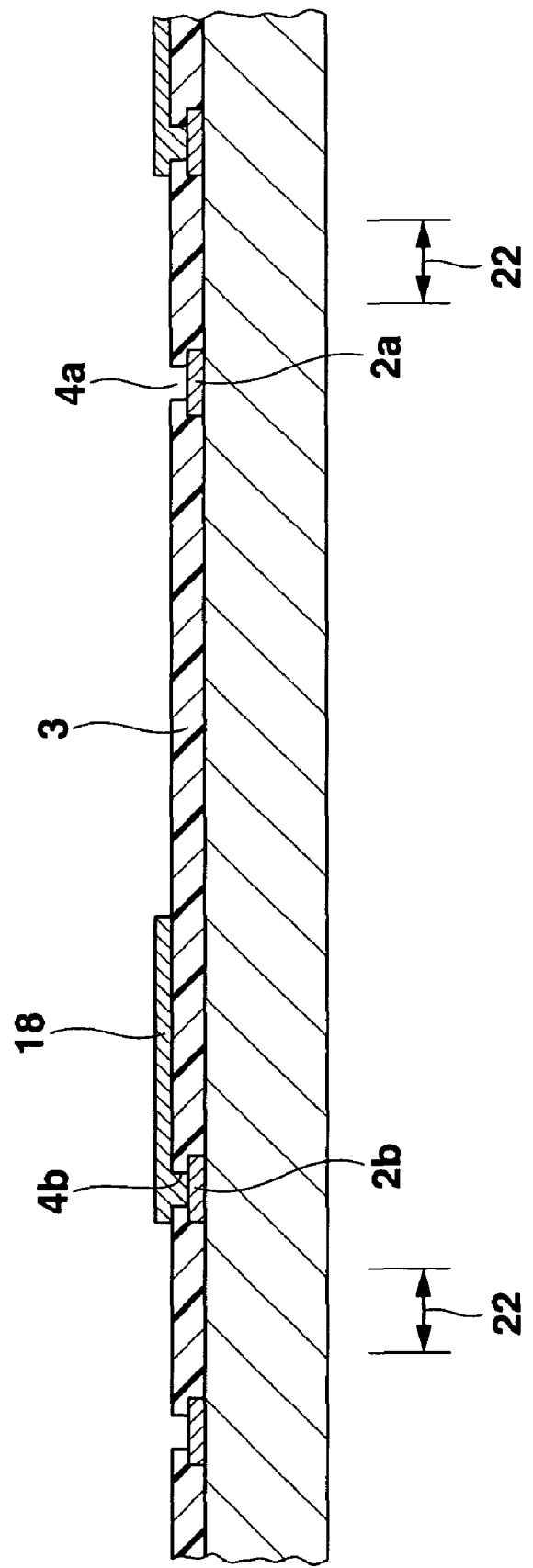
FIG. 13 is a sectional view showing the assembly in a step following FIG. 12.

Next, as shown in FIG. 13, a metal film made of, for example, the aluminum-based metal and formed by, for example, a sputtering method is patterned on the upper surface of the insulating film 3 by, for example, a photolithographic method to form the thin film induction element wiring line 18. In this state, one end of the thin film induction element wiring line 18 is connected to the connection pad 2b via the opening 4b of the insulating film 3.

Figure 14:
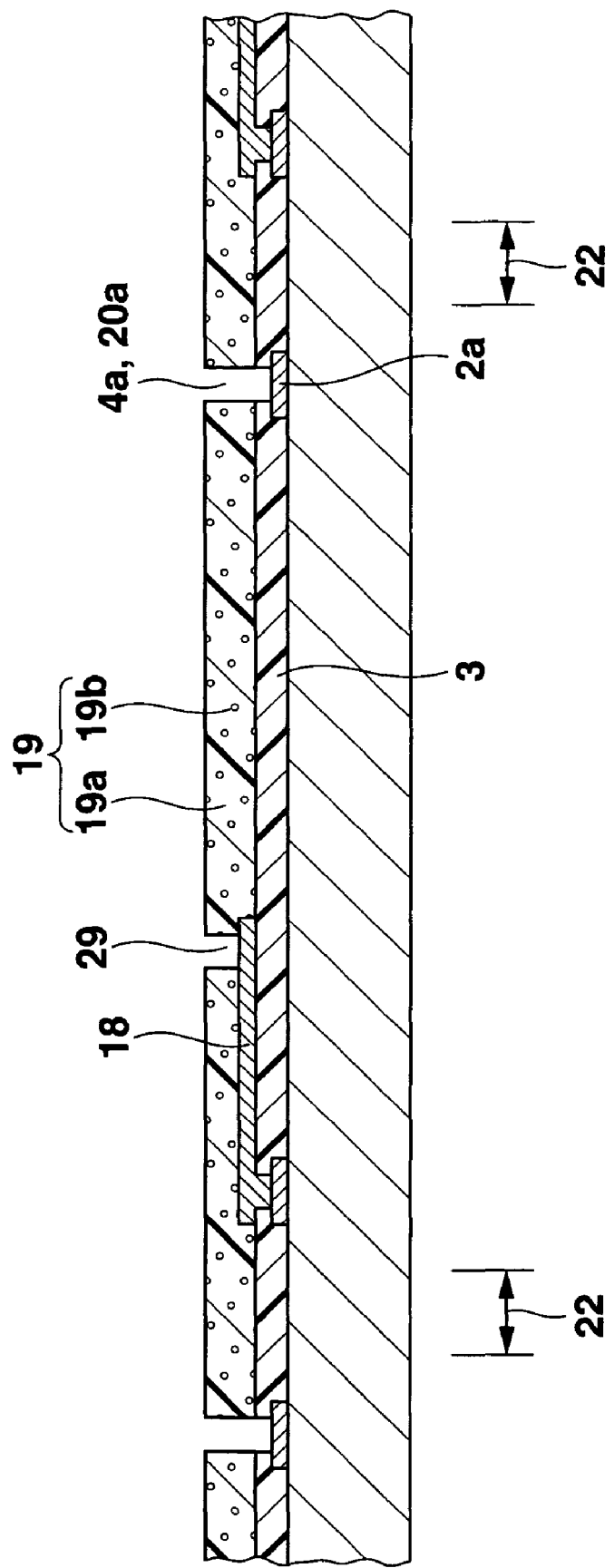
FIG. 14 is a sectional view showing the assembly in a step following FIG. 13.

Next, as shown in FIG. 14, the magnetic film 19 made of a material in which the soft magnetic powder 19b made of, for example, NiCuZn, FeCoBN or CoHfTaPd is mixed into the thermosetting resin 19a made of, for example, the polyimide resin or epoxy resin is formed on the upper surface of the insulating film 3 including the thin film induction element wiring line 18 by, for example, the screen printing method or spin coat method. Then, the openings 20a, 29 are formed in parts of the magnetic film 19 corresponding to the opening 4a of the insulating film 3 and the connection pad portion of the thin film induction element wiring line 18 by laser processing in which a laser beam is radiated or by the photolithographic method.

Figure 15:
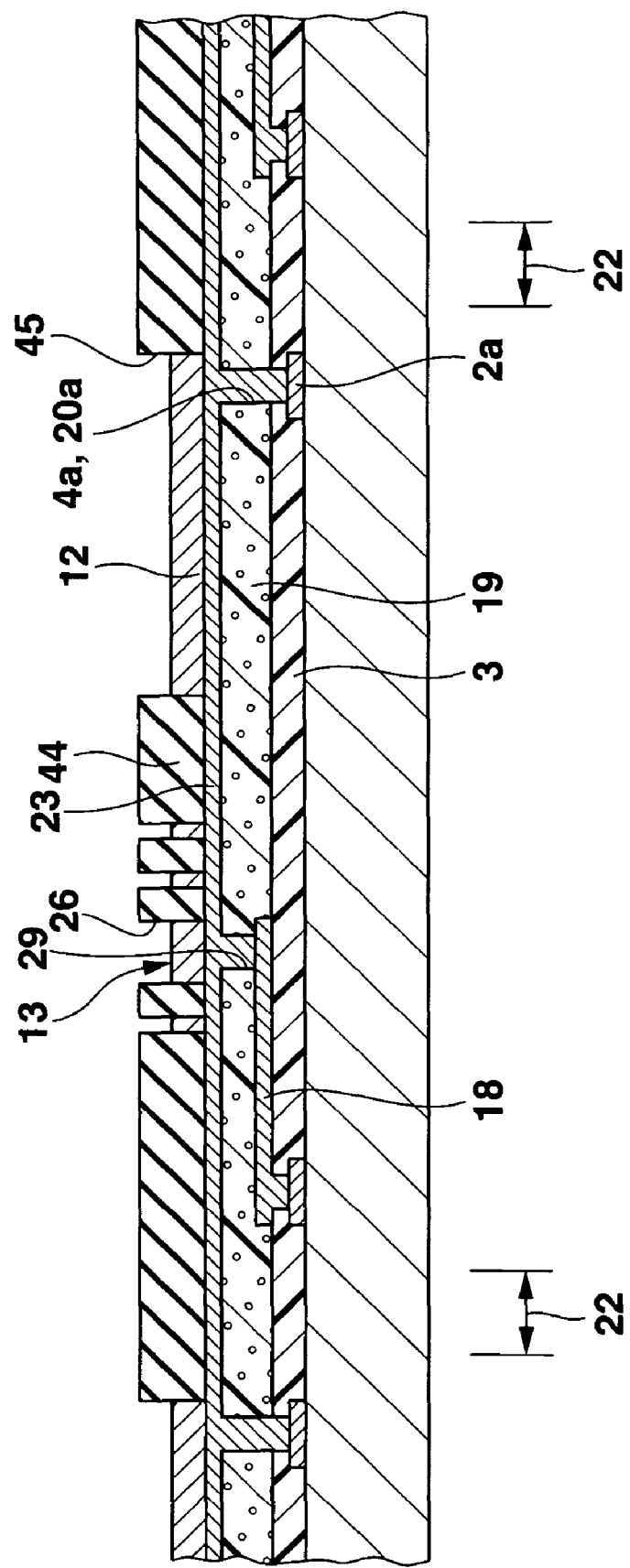
FIG. 15 is a sectional view showing the assembly in a step following FIG. 14.

Next, as shown in FIG. 15, a foundation metal layer 23 is formed on the upper surface of the connection pad 2a exposed via the openings 4a, 7a of the insulating film 3 and the magnetic film 19 and on the entire upper surface of the magnetic film 19 including the upper surface of the connection pad portion of the thin film induction element wiring line 18 exposed via the opening 29 of the magnetic film 19. In this case, the foundation metal layer 23 may only be a copper layer formed by electroless plating, may only be a copper layer formed by sputtering, or may be a copper layer formed by sputtering on a thin film layer such as titanium formed by sputtering.

Next, a plating resist film 44 is patterned/formed on the upper surface of the foundation metal layer 23. In this case, openings 45, 26 are formed in parts of the plating resist film 44 corresponding to a region where the wiring line 12 is to be formed and a region where the thin film induction element 13 is to be formed. Then, electrolytic plating with copper is carried out using the foundation metal layer 23 as a plating current path, thereby forming the wiring line 12 and the thin film induction element 13 on the upper surface of the foundation metal layer 23 in the openings 45, 26 of the plating resist film 44. Subsequently, the plating resist film 44 is released.

Figure 16:
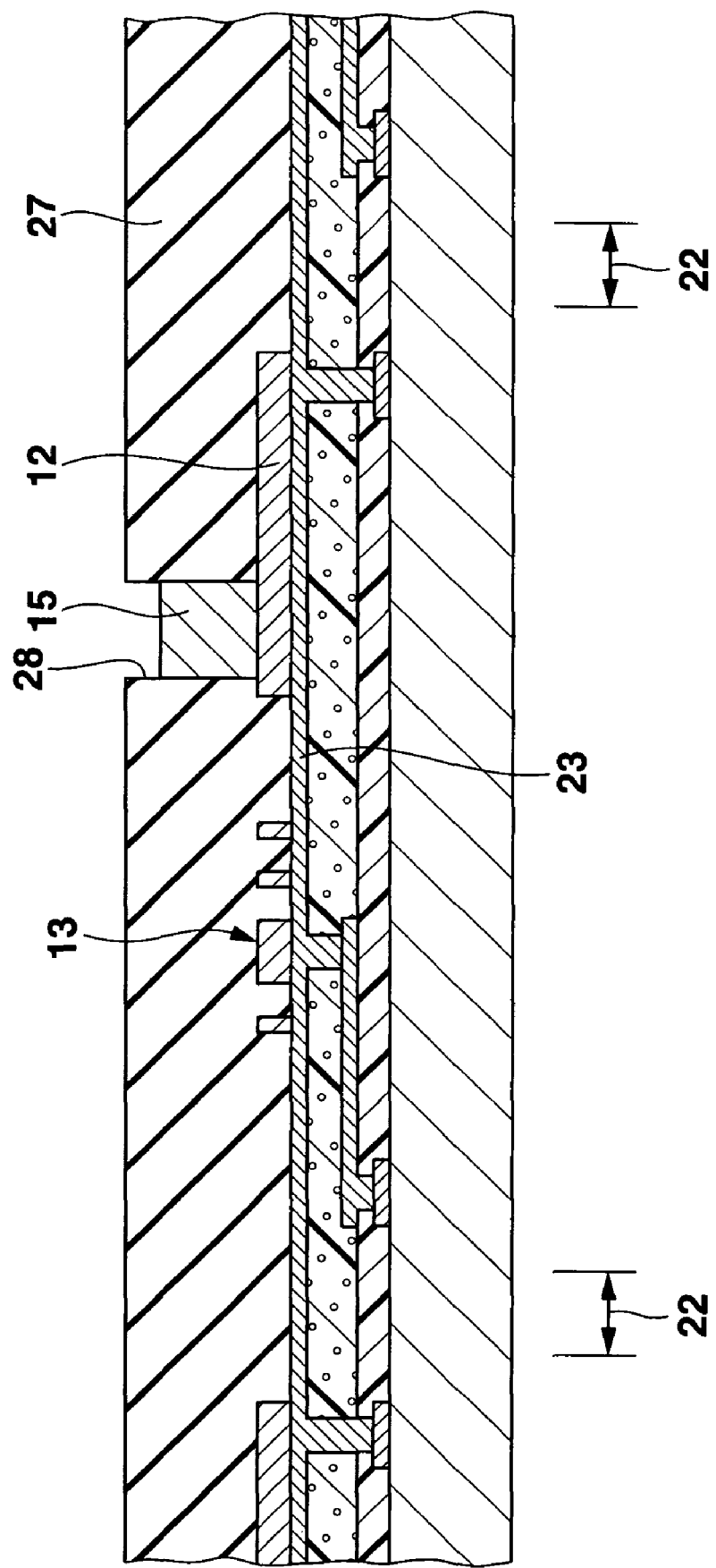
FIG. 16 is a sectional view showing the assembly in a step following FIG. 15.

Next, as shown in FIG. 16, a plating resist film 27 is patterned/formed on the upper surface of the foundation metal layer 23 including the wiring line 12 and the thin film induction element 13. In this case, an opening 28 is formed in a part of the plating resist film 27 corresponding to a region where a connection pad portion of the wiring lines 12, that is, the columnar electrode 15 is to be formed. Then, electrolytic plating with copper is carried out using the foundation metal layer 23 as a plating current path, such that the columnar electrode 15 is formed on the upper surface of the connection pad portion of the wiring line 12 in the opening 28 of the plating resist film 27.

Figure 17:
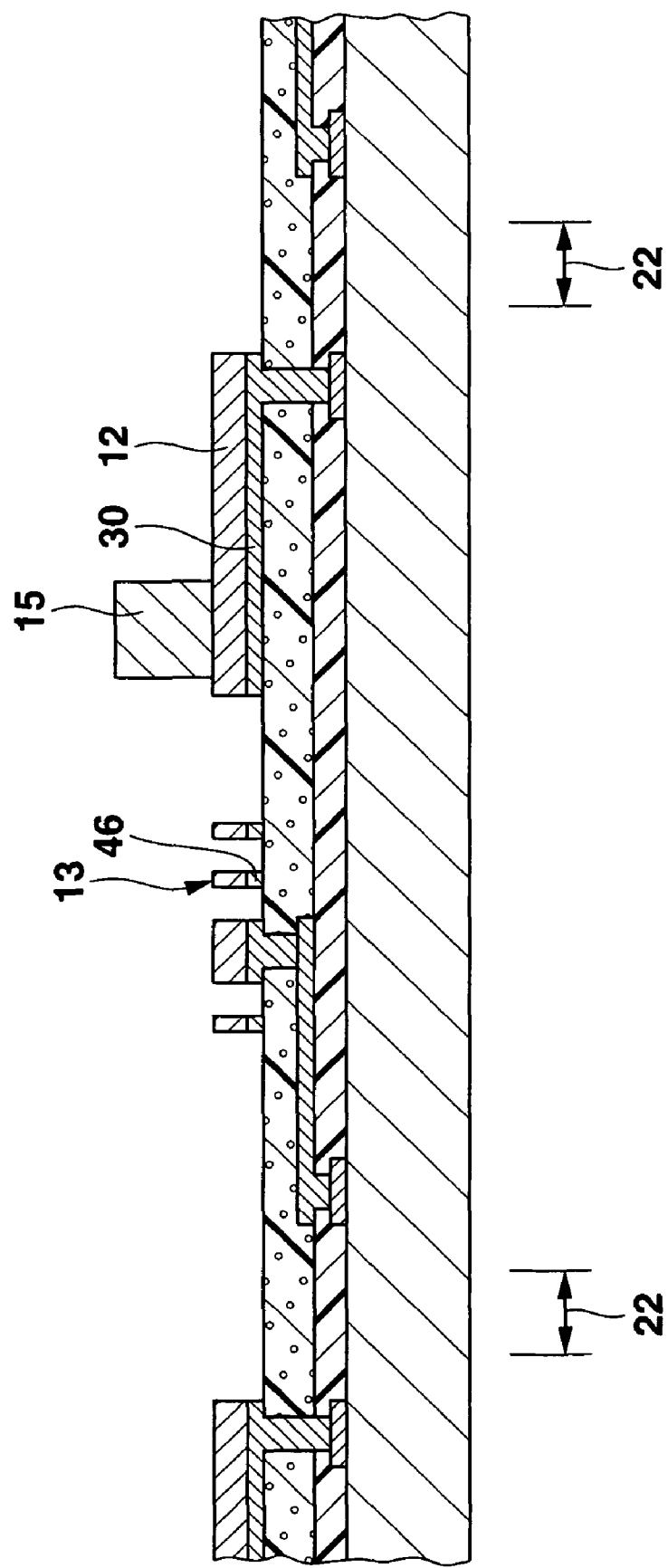
FIG. 17 is a sectional view showing the assembly in a step following FIG. 16.

Next, the plating resist film 27 is released, and then the wiring line 12 and the thin film induction element 13 are used as masks to etch and remove unnecessary parts of the foundation metal layer 23, such that the foundation metal layer 30 and the thin film induction element foundation metal layer 46 remain under the wiring line 12 and the thin film induction element 13 alone, as shown in FIG. 17.

Figure 18:
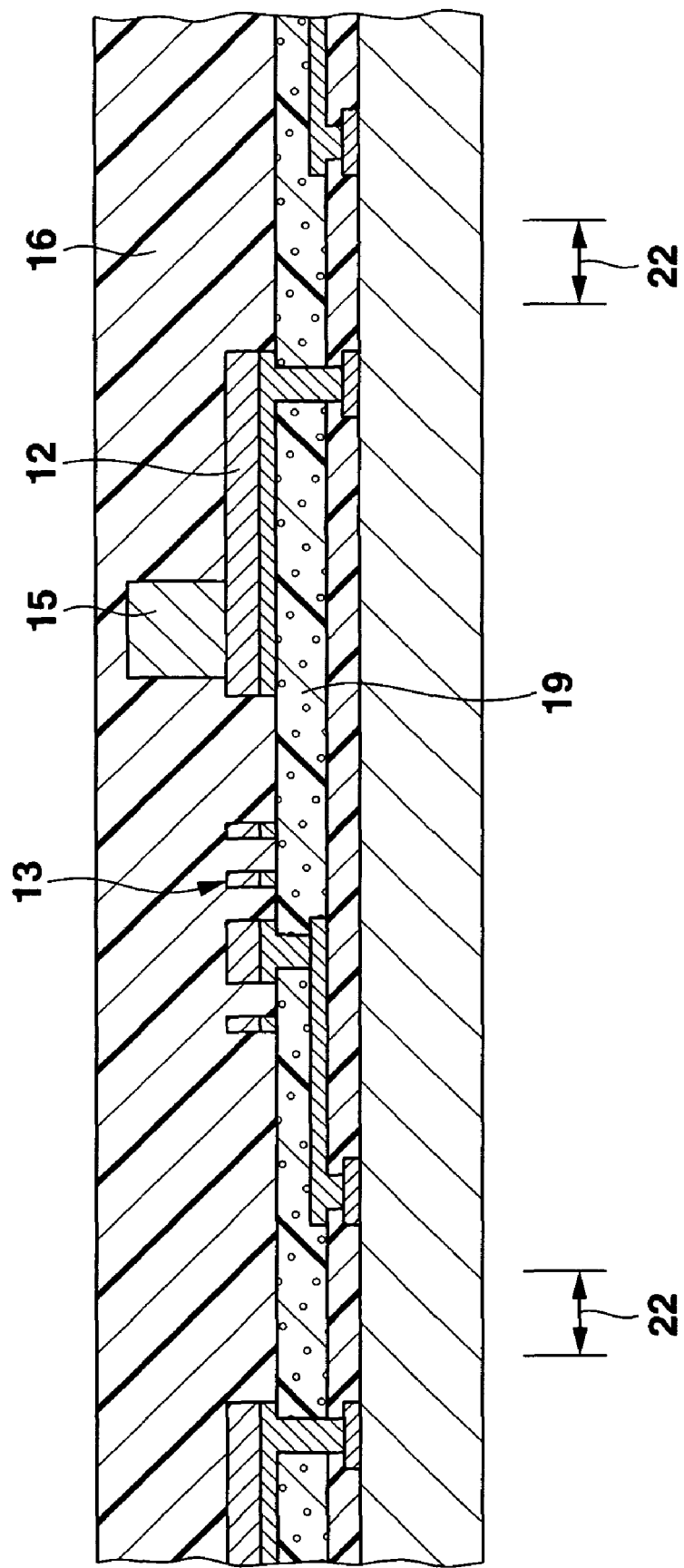
FIG. 18 is a sectional view showing the assembly in a step following FIG. 17.

Next, as shown in FIG. 18, on the upper surface of the magnetic film 19 including the wiring line 12, the thin film induction element 13 and the columnar electrode 15, the sealing film 16 made of made of, for example, an epoxy resin is formed by, for example, the screen printing method or the spin coat method so that the thickness of this sealing film 16 is greater than the height of the columnar electrode 15. Therefore, in this state, the upper surface of the columnar electrode 15 is covered with the sealing film 16.

Figure 19:
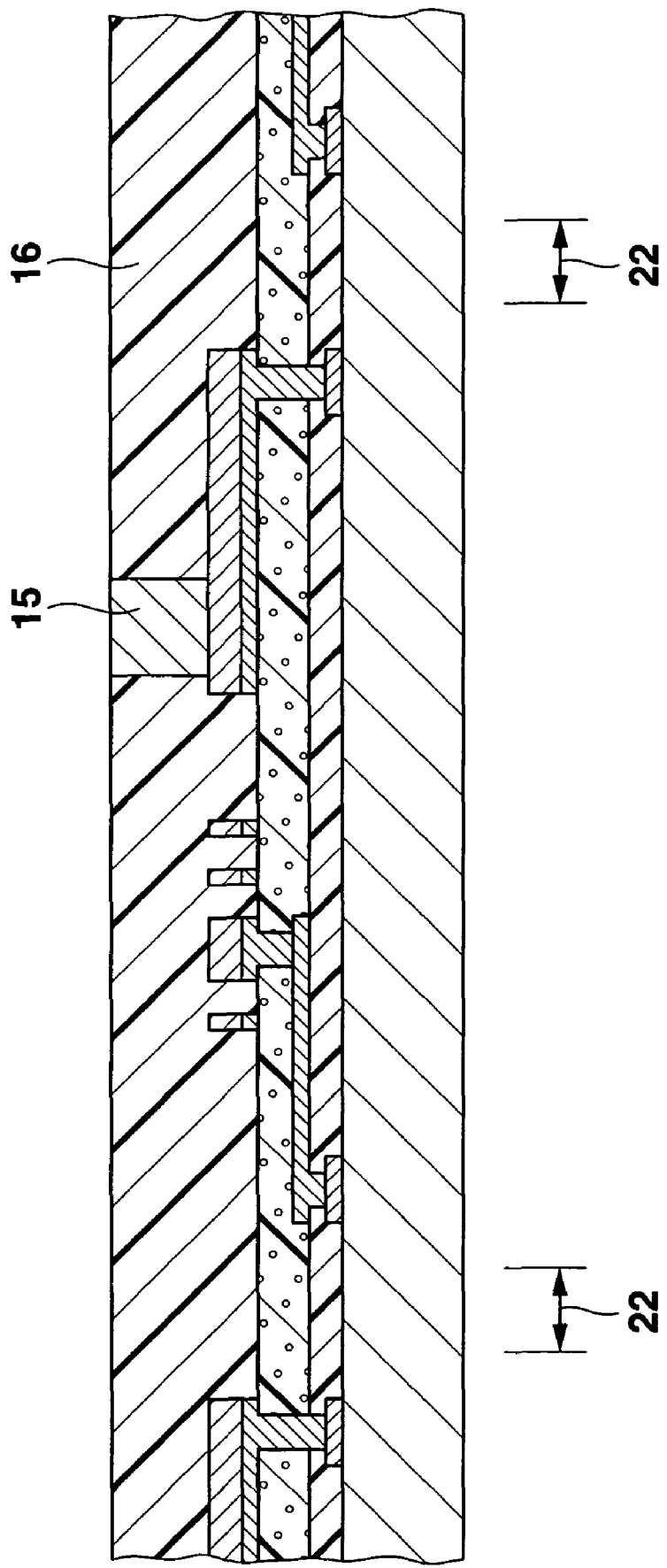
FIG. 19 is a sectional view showing the assembly in a step following FIG. 18.
Figure 20:
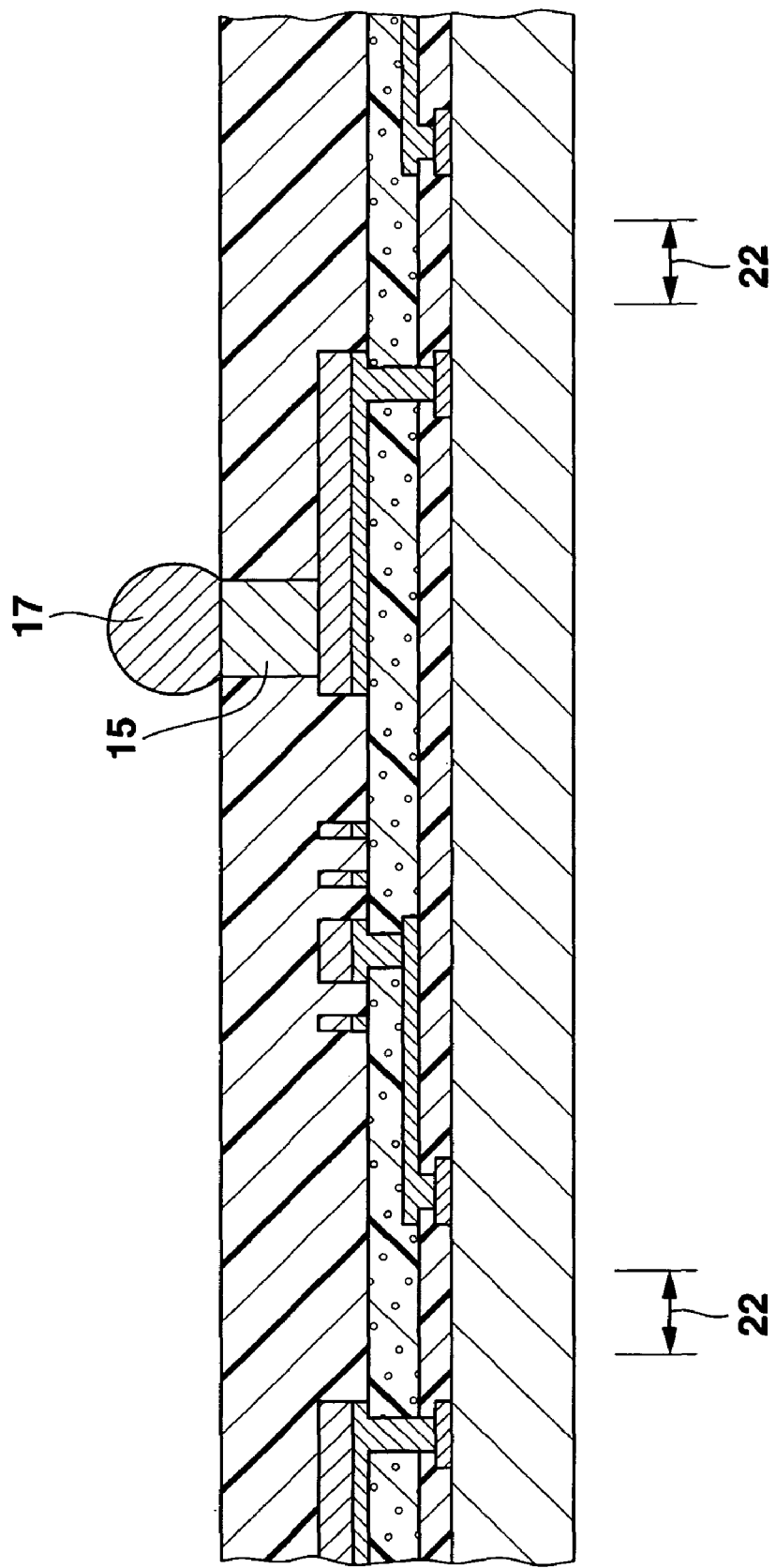
FIG. 20 is a sectional view showing the assembly in a step following FIG. 19.
Figure 21:
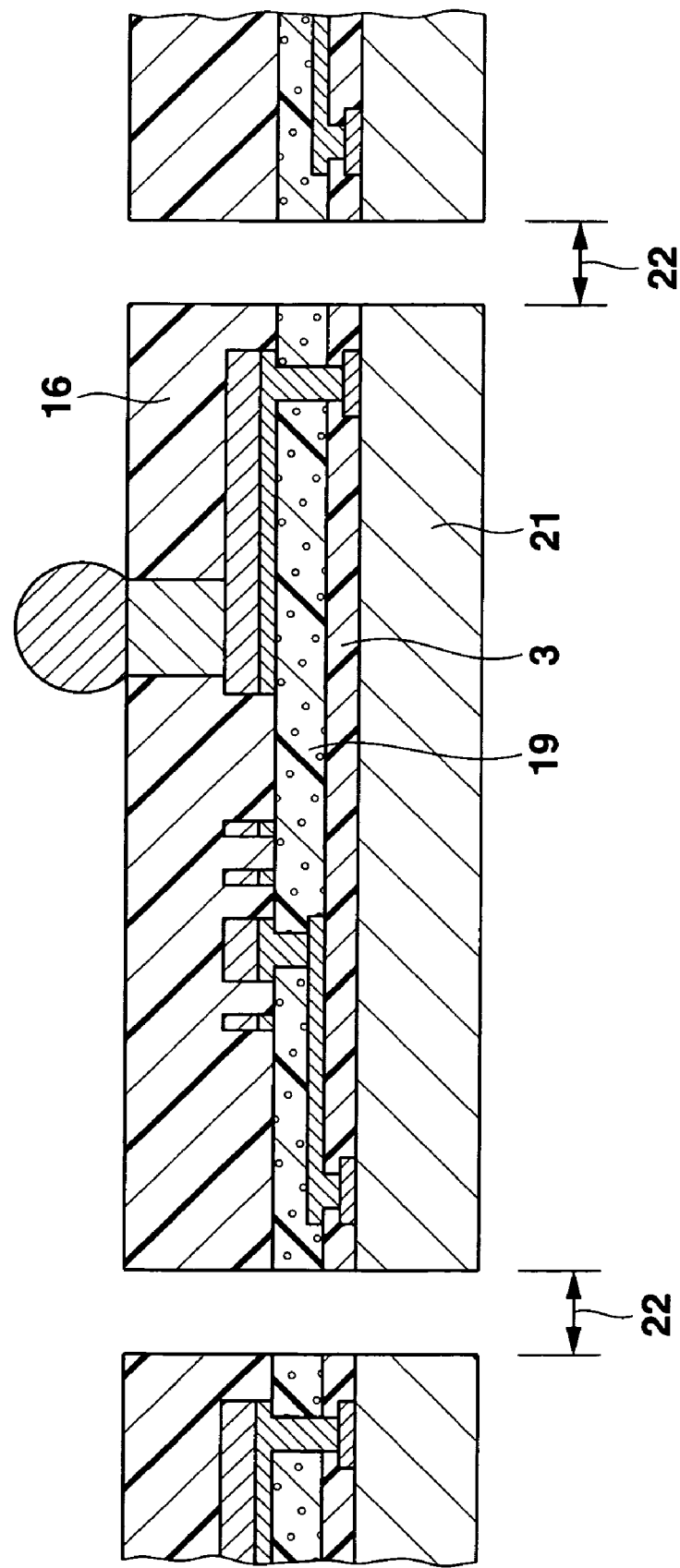
FIG. 21 is a sectional view showing the assembly in a step following FIG. 20.

Next, the upper surface side of the sealing film 16 is properly polished, such that the upper surface of the columnar electrode 15 is exposed, and the upper surface of the sealing film 16 including the exposed upper surface of the columnar electrode 15 is planarized, as shown in FIG. 19. Then, as shown in FIG. 20, the solder ball 17 is formed on the upper surface of the columnar electrode 15. Then, as shown in FIG. 21, the sealing film 16, the magnetic film 19, the insulating film 3 and the semiconductor wafer 21 are diced along the dicing lines 22, thereby obtaining a plurality of semiconductor devices shown in FIG. 11.

Fourth Embodiment

Figure 22A:
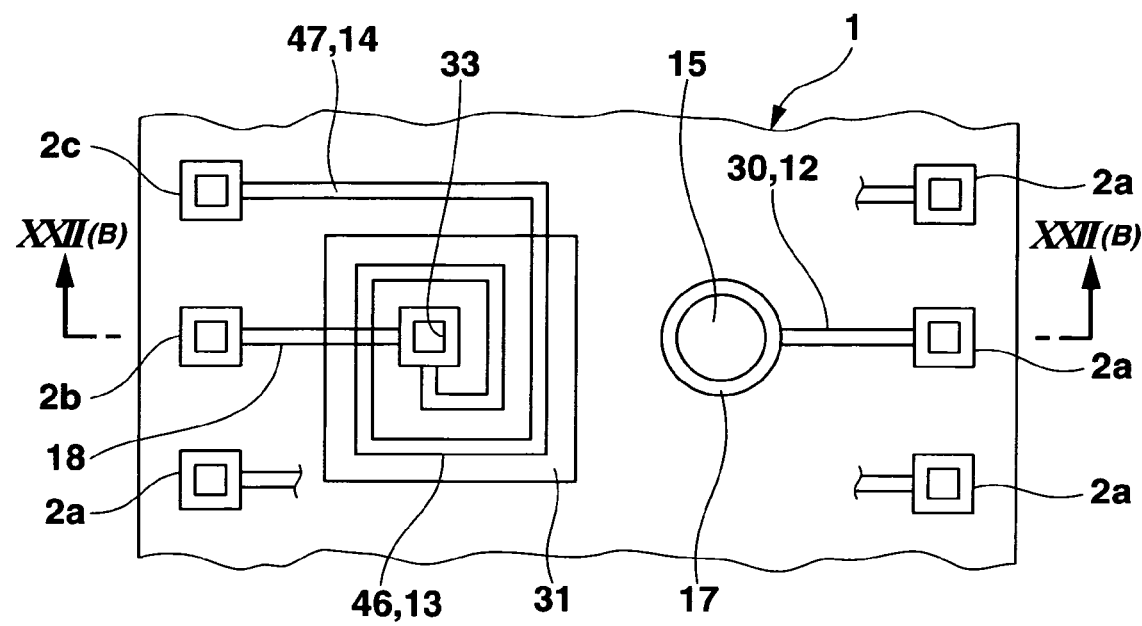
FIG. 22A is a transmitted plan view of essential parts of a semiconductor device according to a fourth embodiment of this invention.
Figure 22B:
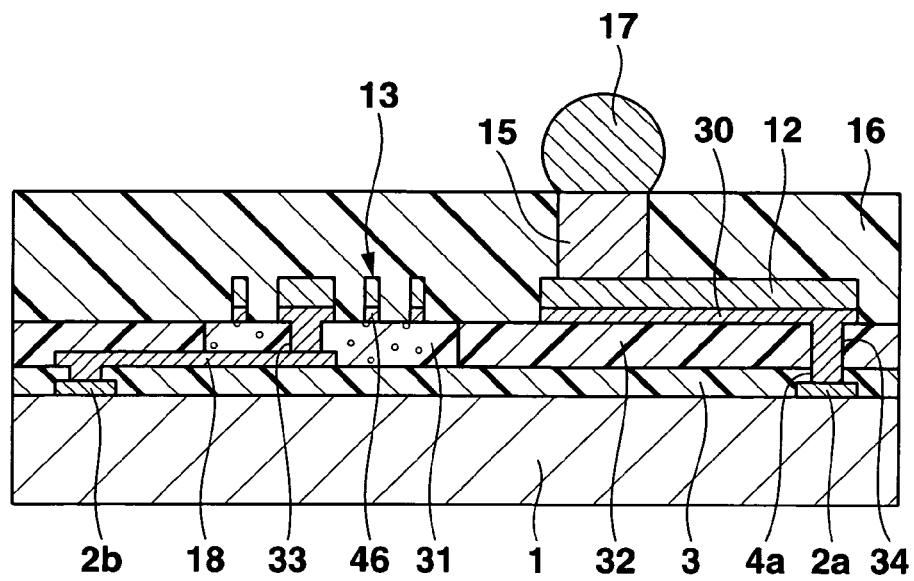
FIG. 22B is a sectional view along the XXII(B)-XXII(B) line in FIG. 22A.

FIG. 22A is a transmitted plan view of essential parts of a semiconductor device as a fourth embodiment of this invention, and FIG. 22B is a sectional view along the XXII(B)-XXII(B) line in FIG. 22A. This semiconductor device is different from the semiconductor device shown in FIGS. 11A, 11B in that a magnetic film 31 is provided on the upper surfaces of parts of a thin film induction element wiring line 18 and parts of an insulating film 3 located under regions where a thin film induction element 13 is formed, and in that a protective film (insulating film) 32 made of, for example, a polyimide resin is provided on the upper surface of the insulating film 3 including the thin film induction element wiring line 18 except for the region where the magnetic film 31 is disposed.

In this case, the magnetic film 31 is formed by affixing a magnetic sheet (a sheet of a magnetic body or a resin sheet including magnetic powder) or by forming a film of a magnetic body using a mask through, for example, sputtering. Further, the inner end of the thin film induction element 13 including a thin film induction element foundation metal layer 46 is connected to the connection pad portion of the thin film induction element wiring line 18 via an opening 33 formed in the magnetic film 31 by, for example, the laser processing. One end of the wiring line 12 including a foundation metal layer 30 is connected to a connection pad 2a via openings 4a, 34 formed in the insulating film 3 and the protective film 32 by, for example, the laser processing.

In this semiconductor device, the magnetic film 31 made of the magnetic sheet or the film of the magnetic body is provided on the upper surface of the insulating film 3 disposed on a silicon substrate 1 under the thin film induction element 13, so that it is possible to reduce an eddy current loss in the thin film induction element 13 due to an eddy current generated in the silicon substrate 1, and it is thus possible to suppress the characteristic deterioration (a decrease of a Q value) of the thin film induction element 13.

Furthermore, in this semiconductor device, the magnetic film 31 is provided under the thin film induction element 13, and the protective film 32 made of a resin is provided under the wiring line 12, so that it is possible to suppress the characteristic deterioration (a decrease of a Q value) of the thin film induction element 13. Moreover, the low-resistance silicon substrate 1 can be used as a virtual ground on which the wiring line 12 is formed via the protective film 32, and the best high frequency characteristics can be provided for the thin film induction element 13 and the wiring line 12.

Fifth Embodiment

Figure 23:
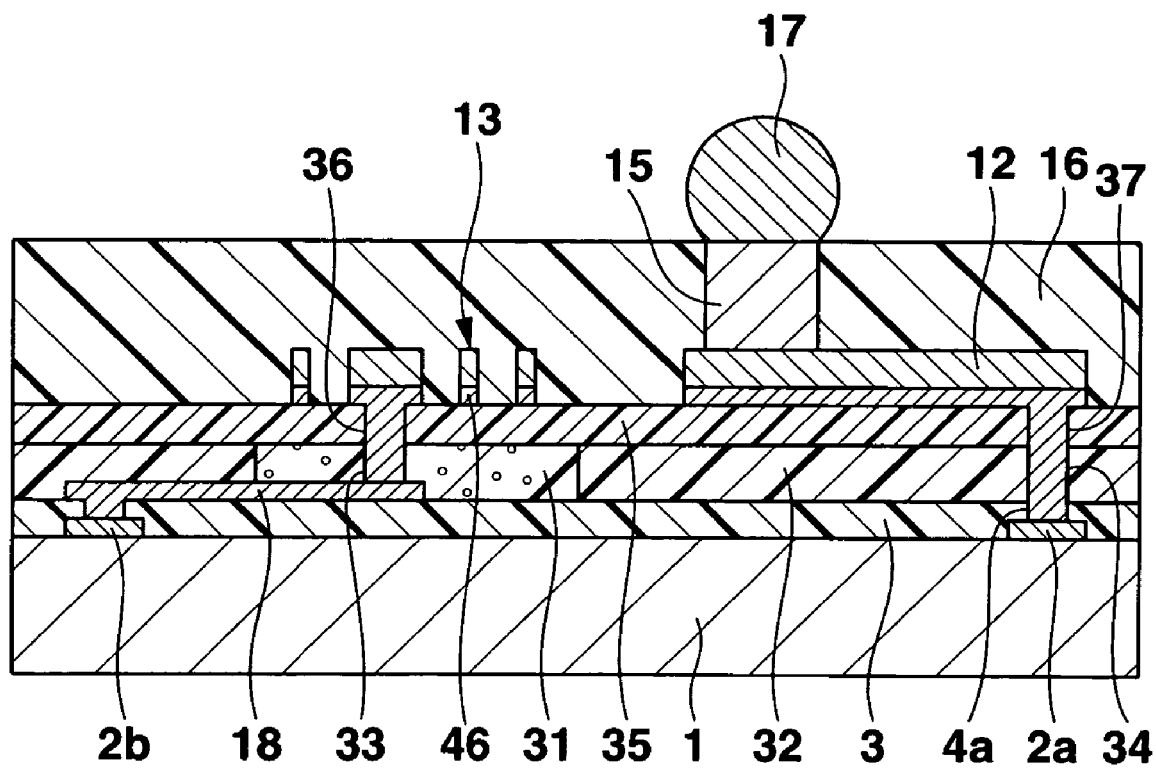
FIG. 23 is a sectional view of essential parts of a semiconductor device as a fifth embodiment of this invention.

FIG. 23 is a sectional view of essential parts of a semiconductor device as a fifth embodiment of this invention. This semiconductor device is different from the semiconductor device shown in FIG. 22B in that an upper protective film (upper insulating film) 35 made of, for example, a polyimide resin is provided on the upper surfaces of a magnetic film 31 and a protective film 32. In this case, the inner end of a thin film induction element 13 including a thin film induction element foundation metal layer 46 is connected to a connection pad portion of a thin film induction element wiring line 18 via an openings 33, 36 formed in a magnetic film 31 and the upper protective film 35 by, for example, the laser processing. One end of a wiring line 12 including a foundation metal layer 30 is connected to a connection pad 2a via openings 4a, 34, 37 formed in the insulating film 3, the protective film 32 and the upper protective film 35 by, for example, the laser processing.

In this semiconductor device, when the adhesion of the thin film induction element foundation metal layer 46 to the magnetic film 31 is poor, this trouble can be eliminated by interposing the upper protective film 35 made of, for example, the polyimide resin in between. Moreover, the thin film induction element 13 can be separated from a silicon substrate 1 as much as the thickness of the upper protective film 35, so that the characteristic deterioration of the thin film induction element 13 is further reduced, and the Q value can be increased.

Sixth Embodiment

Figure 24:
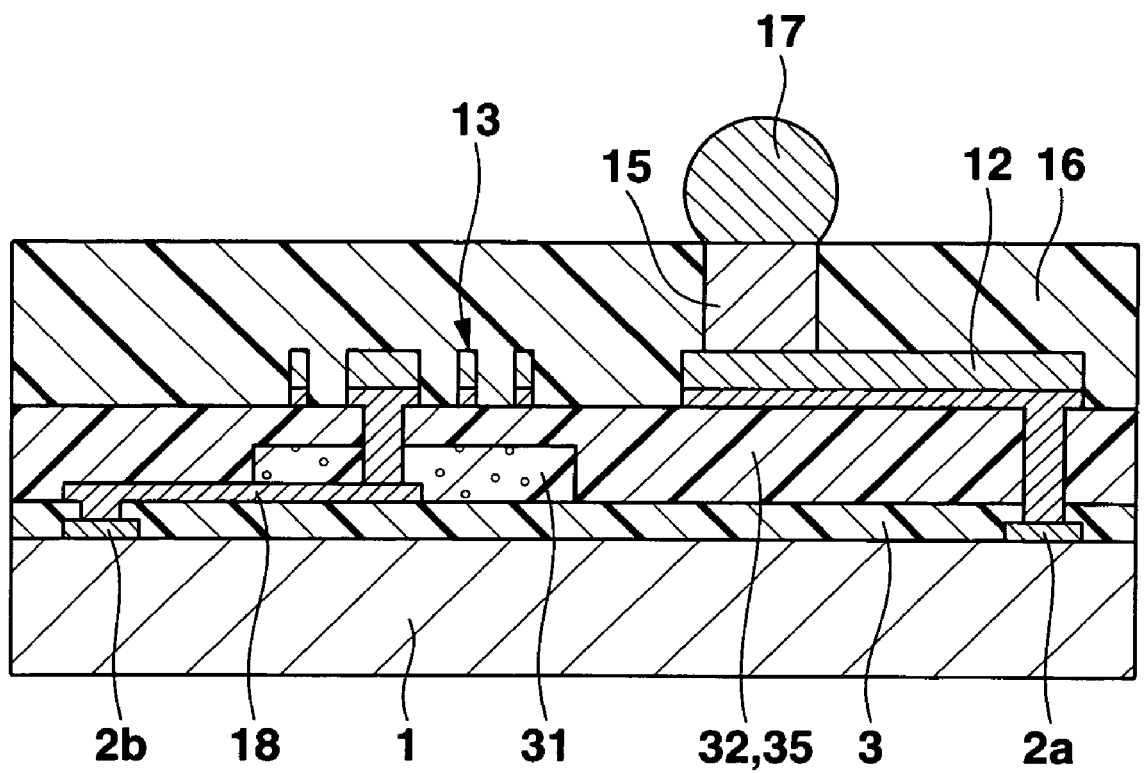
FIG. 24 is a sectional view of essential parts of a semiconductor device as a sixth embodiment of this invention.

FIG. 24 shows a sectional view of essential parts of a semiconductor device as a sixth embodiment of this invention. This semiconductor device is different from the semiconductor device shown in FIG. 23 in that a protective film 32 and an upper protective film 35 are simultaneously formed by, for example, one screen printing or the spin coat method using the same resin material such as a polyimide resin instead of forming these films separately, so that the number of manufacturing processes is reduced.

Seventh Embodiment

Figure 25:
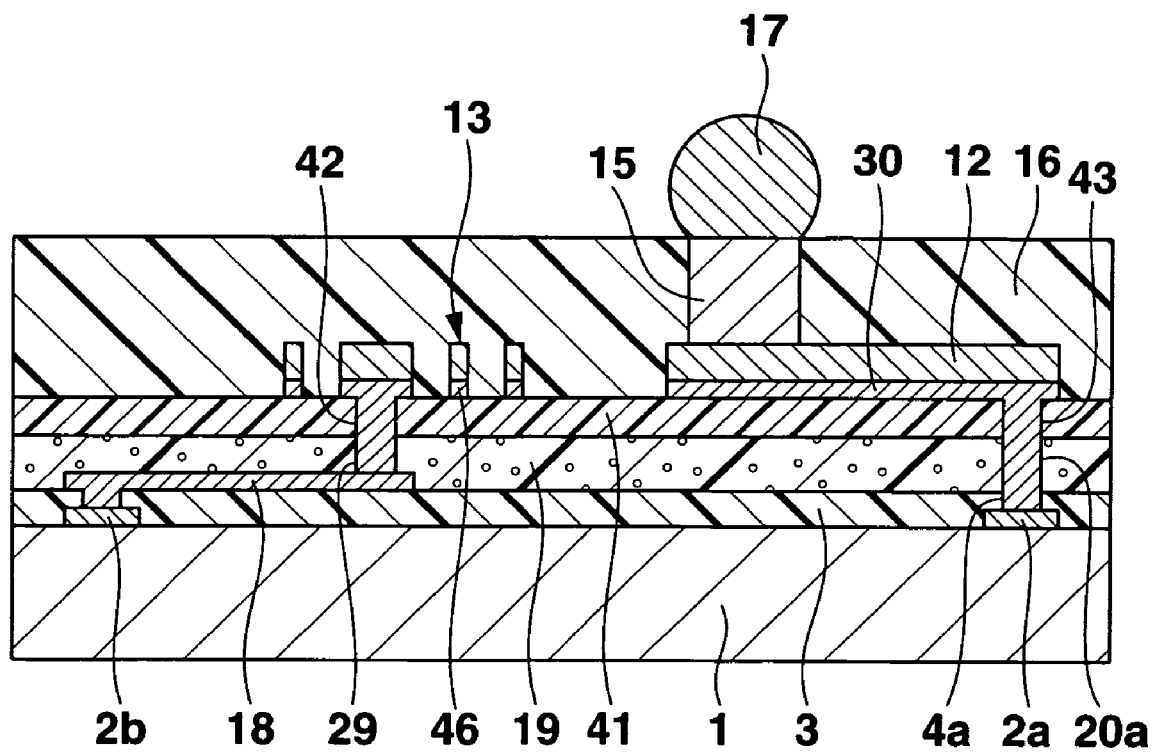
FIG. 25 is a sectional view of essential parts of a semiconductor device as a seventh embodiment of this invention.

FIG. 25 shows a sectional view of essential parts of a semiconductor device as a seventh embodiment of this invention. This semiconductor device is different from the semiconductor device shown in FIG. 11B in that a protective film (insulating film) 41 made of, for example, a polyimide resin is provided on the upper surface of a magnetic film 19. In this case, the inner end of a thin film induction element 13 including a thin film induction element foundation metal layer 46 is connected to a connection pad portion of a thin film induction element wiring line 18 via openings 29, 42 formed in the magnetic film 19 and the protective film 41 by, for example, the laser processing. One end of a wiring line 12 including a foundation metal layer 30 is connected to a connection pad 2a via openings 4a, 7a, 43 formed in an insulating film 3, the magnetic film 19 and the protective film 41 by, for example, the laser processing. In such a case, the thin film induction element 13 can be separated from a silicon substrate 1 as much as the thickness of the protective film 41, so that the characteristic deterioration of the thin film induction element 13 is further reduced, and the Q value can be increased.

In addition, in all the embodiments described above, the soft magnetic powder 10b, 19b may be mixed into all of the thermosetting resin 10a, 19a, the sealing film 16 and the protective film 5.

What is claimed is:

1. A semiconductor device comprising:
   a semiconductor substrate;
   an insulating layer provided on the semiconductor substrate; and
   a plurality of wiring lines and at least one spiral thin film induction element provided on the insulating layer,
   wherein a magnetic film is provided on at least one part of the insulating layer under said at least one thin film induction element;
   wherein the magnetic film comprises a magnetic sheet provided on the insulating layer under the thin film induction element;
   wherein an insulating film made of a resin is provided on the insulating layer except for a region where the magnetic sheet is disposed; and
   wherein an upper insulating film made of a resin is provided between (i) the wiring lines and the thin film induction element, and (ii) the magnetic film and the insulating film.

2. The semiconductor device according to claim 1, wherein a thin film induction element wiring line is provided on the insulating layer under the magnetic film, and an inner end of the thin film induction element is connected to a connection pad portion of the thin film induction element wiring line via an opening provided in the magnetic film.

3. The semiconductor device according to claim 1, wherein the wiring lines and said at least one thin film induction element are made of a same material.

4. The semiconductor device according to claim 1, wherein the insulating film and the upper insulating film are formed of a same material.

5. The semiconductor device according to claim 1, further comprising columnar electrodes provided on connection pad portions of the plurality of wiring lines.

6. The semiconductor device according to claim 5, further comprising a sealing film provided on peripheries of the columnar electrodes.

7. The semiconductor device according to claim 6, further comprising solder balls provided on the columnar electrodes.

* * * * *

UNITED STATES PATENT AND TRADEMARK OFFICE
CERTIFICATE OF CORRECTION

| | | |
|---|---|---|
| PATENT NO. | : 8,110,882 B2 | |
| APPLICATION NO. | : 12/069689 | |
| DATED | : February 7, 2012 | |
| INVENTOR(S) | : Yutaka Aoki | |

It is certified that error appears in the above-identified patent and that said Letters Patent is hereby corrected as shown below:

On the title page:

Item (73) Assignee:

change "Casio Computer Co., Ltd., Tokyo (JP)" to --Teramikros. Inc., Tokyo (JP)--.

Signed and Sealed this
Twelfth Day of June, 2012

David J. Kappos
*Director of the United States Patent and Trademark Office*